US012369449B2

(12) United States Patent
Lim et al.

(10) Patent No.: US 12,369,449 B2
(45) Date of Patent: Jul. 22, 2025

(54) IMAGE SENSORS AND IMAGE PROCESSING APPARATUS AND ELECTRONIC DEVICES

(71) Applicant: Samsung Electronics Co., Ltd., Suwon-si (KR)

(72) Inventors: Seon-Jeong Lim, Yongin-si (KR); Hyeongju Kim, Changwon-si (KR); Kyung Bae Park, Hwaseong-si (KR); Sung Young Yun, Suwon-si (KR); Taejin Choi, Suwon-si (KR); Chul Joon Heo, Busan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 887 days.

(21) Appl. No.: 17/217,315

(22) Filed: Mar. 30, 2021

(65) Prior Publication Data

US 2021/0305320 A1  Sep. 30, 2021

(30) Foreign Application Priority Data

Mar. 31, 2020 (KR) .................. 10-2020-0039307
Aug. 31, 2020 (KR) .................. 10-2020-0110162

(51) Int. Cl.
*H01L 27/30* (2006.01)
*H10K 30/57* (2023.01)
(Continued)

(52) U.S. Cl.
CPC .............. *H10K 30/57* (2023.02); *H10K 39/32* (2023.02); *H10K 85/211* (2023.02);
(Continued)

(58) Field of Classification Search
CPC ...... H10K 39/32; H10K 30/30; H10K 85/211; H10K 85/311; H10K 85/40; H10K 85/654;
(Continued)

(56) References Cited

U.S. PATENT DOCUMENTS 7,129,466 B2  10/2006  Iwasaki
7,375,370 B2   5/2008  Forrest et al.
(Continued)

FOREIGN PATENT DOCUMENTS

EP    3113225 A1 *  1/2017  .......... H01L 27/307
JP    2011-77198 A    4/2011
(Continued)

OTHER PUBLICATIONS

Seo, Hokuto, et al. "Color Sensors with Three Vertically Stacked Organic Photodetectors", Japanese Journal of Applied Physics, vol. 46, No. 49, Dec. 14, 2007, pp. L1240-L1242.
(Continued)

*Primary Examiner* — Ermias T Woldegeorgis
(74) *Attorney, Agent, or Firm* — Harness, Dickey & Pierce, P.L.C.

(57) ABSTRACT

An image sensor includes first and second organic photoelectric conversion devices stacked in a vertical direction and configured to selectively absorb light in a part of visible wavelength spectrum and non-selectively absorb light in the visible wavelength spectrum, respectively. The first organic photoelectric conversion device may selectively absorb light in a blue wavelength spectrum, and the second organic photoelectric conversion device may selectively absorb light in a green wavelength spectrum. The image sensor may have stacked organic photoelectric conversion devices configured to selectively absorb light in a red wavelength spectrum and a green wavelength spectrum, respectively.

45 Claims, 12 Drawing Sheets

(51) Int. Cl.
*H10K 39/32* (2023.01)
*H10K 85/20* (2023.01)
*H10K 85/30* (2023.01)
*H10K 85/40* (2023.01)
*H10K 85/60* (2023.01)
*H10K 30/30* (2023.01)

(52) U.S. Cl.
CPC ........... *H10K 85/311* (2023.02); *H10K 85/40* (2023.02); *H10K 85/654* (2023.02); *H10K 85/6572* (2023.02); *H10K 30/30* (2023.02)

(58) Field of Classification Search
CPC .. H10K 85/6572; H10K 85/652; H10K 30/57; Y02E 10/549
See application file for complete search history.

(56) References Cited

U.S. PATENT DOCUMENTS

| | | | |
|---|---|---|---|
| 9,018,688 | B2 | 4/2015 | Yamaguchi |
| 9,350,930 | B2 | 5/2016 | Lee et al. |
| 9,369,647 | B2 | 6/2016 | Yamaguchi |
| 9,466,645 | B2 | 10/2016 | Yamaguchi |
| 9,762,867 | B2 | 9/2017 | Yamaguchi |
| 9,780,130 | B2 | 10/2017 | Suh et al. |
| 10,271,023 | B2 | 4/2019 | Yamaguchi |
| 10,644,073 | B2 | 5/2020 | Lee et al. |
| 10,715,768 | B2 | 7/2020 | Yamaguchi |
| 2007/0120045 | A1* | 5/2007 | Yokoyama ............ H10K 30/82 250/214 R |
| 2015/0221702 | A1* | 8/2015 | Jung ................. H01L 27/14643 257/40 |
| 2016/0380032 | A1 | 12/2016 | Park et al. |
| 2018/0006090 | A1 | 1/2018 | Leem et al. |
| 2019/0131541 | A1 | 5/2019 | Choi et al. |
| 2020/0304761 | A1 | 9/2020 | Yamaguchi |

FOREIGN PATENT DOCUMENTS

| | | |
|---|---|---|
| JP | 4817584 B2 | 11/2011 |
| JP | 2012-129276 A | 7/2012 |
| JP | 2013-084785 A | 5/2013 |
| JP | 2013-183056 A | 9/2013 |
| JP | 2017-175102 A | 9/2017 |
| JP | 2018-98495 A | 6/2018 |
| JP | 2019-208026 A | 12/2019 |
| KR | 2015-0078162 A | 7/2015 |
| KR | 2015-0145934 A | 12/2015 |
| KR | 10-2017-0004672 A | 1/2017 |
| KR | 2017-0022177 A | 3/2017 |
| KR | 2018-0071192 A | 6/2018 |
| KR | 10-1980199 B1 | 5/2019 |
| KR | 10-2019-0064868 A | 6/2019 |
| KR | 10-2019-0083773 A | 7/2019 |

OTHER PUBLICATIONS

Aihara, Satoshi, et al. "Stacked Image Sensor With Green- and Red-Sensitive Organic Photoconductive Films Applying Zinc Oxide Thin-Film Transistors to a Signal Readout Circuit", IEEE Transactions on Electron Devices, vol. 56, No. 11, Nov. 2009, pp. 2570-2576.

Lim, Seon-Jeong, et al. "Organic-on-silicon complementary metal-oxide-semiconductor colour sensors", Scientific Reports, Jan. 12, 2015, DOI: 10.1038/srep07708.

Ihama, Mikio, et al. "CMOS Image Sensor with a Thin Overlaid Panchromatic Organic Photoconductive Layer for Sensors with Reduced Pixel Size", IDW '09, pp. 2123-2126.

Extended European Search Report dated Aug. 23, 2021 for corresponding European Application No. 21166067.5.

Extended European Search Report dated Jul. 12, 2024 for corresponding European Application No. 24176945.4.

Korean Office Action dated Nov. 29, 2024 for corresponding Korean Application No. 10-2020-0110162, and English-language translation thereof.

Japanese Office Action dated Jan. 7, 2025 for corresponding Japanese Application No. 2021-59563, and English-language translation thereof.

* cited by examiner

IMAGE SENSORS AND IMAGE PROCESSING APPARATUS AND ELECTRONIC DEVICES

CROSS-REFERENCE TO RELATED APPLICATIONS

This application claims priority to and the benefit of Korean Patent Application No. 10-2020-0039307 filed in the Korean Intellectual Property Office on Mar. 31, 2020, and Korean Patent Application No. 10-2020-0110162 filed in the Korean Intellectual Property Office on Aug. 31, 2020, the entire contents of each of which are incorporated herein by reference.

BACKGROUND

1. Field

Image sensors and electronic devices are disclosed.

2. Description of the Related Art

CMOS image sensor using one or more silicon photodiodes have a pixel having a smaller size as the resolution of the CMOS image sensor becomes higher resolution. However, as the pixel size decreases, the light absorption area of the silicon photodiode decreases, and thus sensitivity of the CMOS image sensor may decrease.

SUMMARY

According to some example embodiments, an image sensor may include a first organic photoelectric conversion device and a second organic photoelectric conversion device under the first organic photoelectric conversion device such that the first organic photoelectric conversion device at least partially overlaps the second organic photoelectric conversion device in a vertical direction that is perpendicular to an upper surface of the first organic photoelectric conversion device. The first organic photoelectric conversion device may be configured to selectively absorb light in a first wavelength spectrum within a visible wavelength spectrum and convert the selectively absorbed light in the first wavelength spectrum into a first electrical signal. The second organic photoelectric conversion device may be configured to non-selectively absorb light in the visible wavelength spectrum and convert the non-selectively absorbed light in the visible wavelength spectrum into a second electrical signal. The image sensor may have a first partition and a second partition offset from each other along an in-plane direction that is perpendicular to the vertical direction and parallel to the upper surface of the first organic photoelectric conversion device. The first partition may include at least a first portion of the first organic photoelectric conversion device, at least a first portion of the second organic photoelectric conversion device, and a first optical filter between the first portions of the first organic photoelectric conversion device and the second organic photoelectric conversion device in the vertical direction, the first optical filter being configured to selectively transmit light in a second wavelength spectrum within the visible wavelength spectrum, the second wavelength spectrum being different from the first wavelength spectrum. The second partition may include at least a second portion of the first organic photoelectric conversion device, at least a second portion of the second organic photoelectric conversion device, and a second optical filter between the second portions of the first organic photoelectric conversion device and the second organic photoelectric conversion device in the vertical direction, the second optical filter being configured to selectively transmit light in a third wavelength spectrum within the visible wavelength spectrum, the third wavelength spectrum being different from both the first wavelength spectrum and the second wavelength spectrum.

The first organic photoelectric conversion device may be configured to selectively absorb light in a green wavelength spectrum and convert the selectively absorbed light in the green wavelength spectrum into the first electrical signal.

The first optical filter may be configured to selectively transmit light in at least a blue wavelength spectrum.

The second optical filter may be configured to selectively transmit light in at least a red wavelength spectrum.

The first organic photoelectric conversion device and the second organic photoelectric conversion device may independently include an upper electrode, a lower electrode, and an organic photoelectric conversion layer between the upper electrode and the lower electrode, the organic photoelectric conversion layer including at least one p-type semiconductor material and at least one n-type semiconductor material.

The at least one p-type semiconductor material of the first organic photoelectric conversion device and the at least one p-type semiconductor material of the second organic photoelectric conversion device may independently include a compound represented by Chemical Formula A-1:

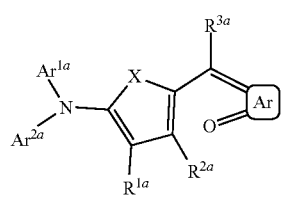

[Chemical Formula A-1]

wherein, in Chemical Formula A-1, X is O, S, Se, Te, SO, $SO_2$, or $SiR^aR^b$, Ar is a substituted or unsubstituted C6 to C30 arylene group, a substituted or unsubstituted C3 to C30 heterocyclic group, or a first fused ring of two or more thereof, $Ar^{1a}$ and $Ar^{2a}$ are independently a substituted or unsubstituted C6 to C30 aryl group or a substituted or unsubstituted C3 to C30 heteroaryl group, $Ar^{1a}$ and $Ar^{2a}$ are independently present or are linked to each other to form a second fused ring, and $R^{1a}$ to $R^{3a}$, $R^a$, and $R^b$ are independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a combination thereof.

The at least one p-type semiconductor material of the first organic photoelectric conversion device and the at least one p-type semiconductor material of the second organic photoelectric conversion device may independently include one or more compounds represented by any one of Chemical Formulas A-2 to A-9:

[Chemical Formula A-2]

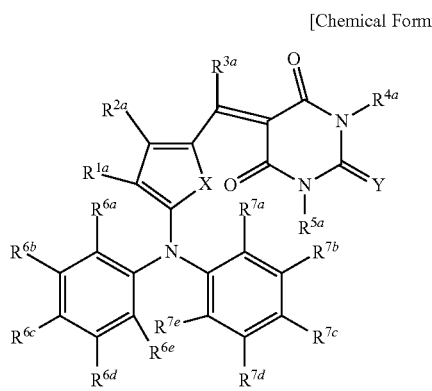

[Chemical Formula A-3]

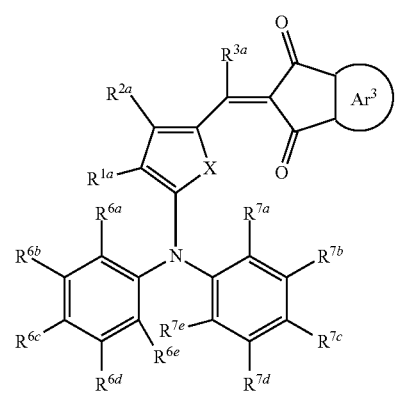

[Chemical Formula A-4]

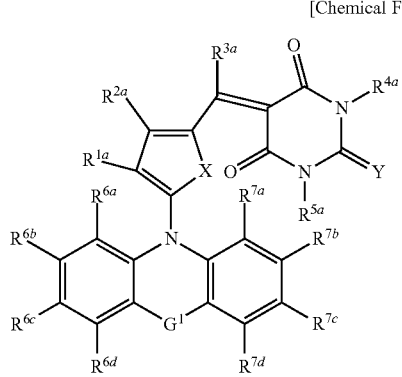

[Chemical Formula A-5]

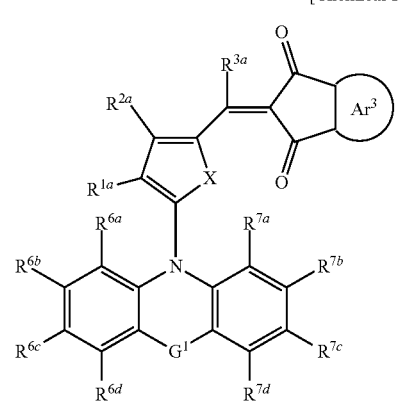

[Chemical Formula A-6]

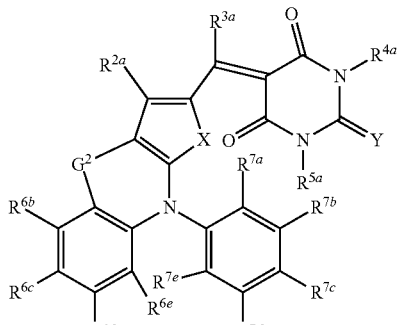

[Chemical Formula A-7]

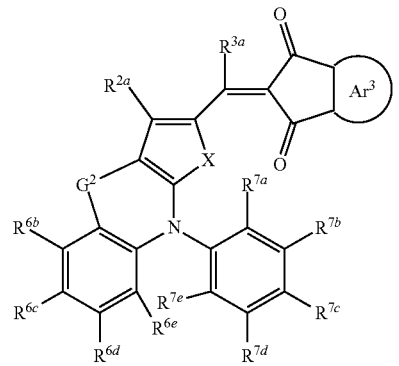

[Chemical Formula A-8]

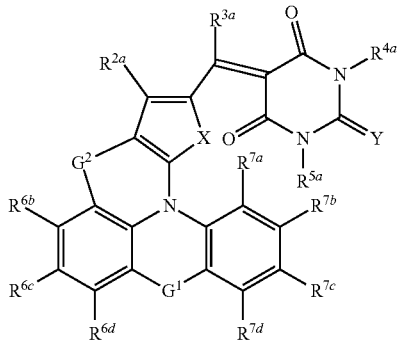

[Chemical Formula A-9]

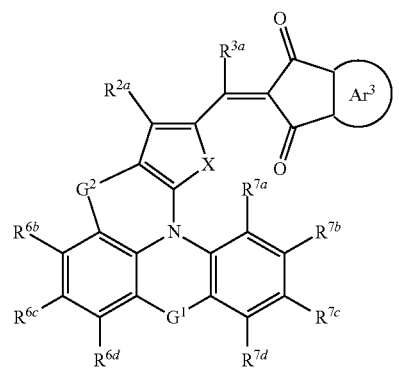

wherein, in Chemical Formulas A-2 to A-9, X is O, S, Se, Te, SO, $SO_2$, or $SiR^aR^b$, $Ar^3$ is a substituted or unsubstituted C6 to C30 arylene group, a substituted or unsubstituted C3 to C30 heterocyclic group, or a first fused ring of two or more thereof, $R^{1a}$ to $R^{5a}$, $R^a$, and $R^b$ are independently one of hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a combination thereof, $G^1$ and $G^2$ are independently a single bond, $-(CR^cR^d)_{n1}-$ wherein n1 is an integer of 1 or 2, $-O-$, $-S-$, $-Se-$, $-N=$, $-NR^e-$, $-SiR^fR^g-$, or $-GeR^hR^i-$, wherein $R^c$ to $R^i$ are independently hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, a cyano group, or a combination thereof, wherein $R^c$ and $R^d$, $R^f$ and $R^g$, and $R^h$ and $R^i$ are independently present or are linked to each other to form a ring, Y is O, S, Se, Te, or $C(R^t)(CN)$, wherein $R^j$ is hydrogen, a cyano group (—CN), or a C1 to C10 alkyl group, $R^{6a}$ to $R^{6e}$ and $R^{7a}$ to $R^{7e}$ are independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a combination thereof, and $R^{1a}$ to $R^{3a}$, $R^{6a}$ to $R^{6e}$, and $R^{7a}$ to $R^{7e}$ are independently present or adjacent two thereof are linked to each other to form a second fused ring.

A content of the n-type semiconductor material of the second organic photoelectric conversion device is between about 1.0 time and about 100.0 times of a content of the n-type semiconductor material of the first organic photoelectric conversion device.

The organic photoelectric conversion layer of the first organic photoelectric conversion device may have a volume ratio of the n-type semiconductor material to the p-type semiconductor material of greater than or equal to about 0.2 and less than or equal to about 2.0.

The organic photoelectric conversion layer of the second organic photoelectric conversion device may have a volume ratio of the n-type semiconductor material to the p-type semiconductor material of greater than or equal to about 2.0 and less than or equal to about 20.0.

The at least one n-type semiconductor material of the first organic photoelectric conversion device and the at least one n-type semiconductor material of the second organic photoelectric conversion device may independently include one or more of an organic metal complex, a derivative of an organic metal complex, carboxylic anhydride, a derivative of carboxylic anhydride, perylene diimide, a derivative of perylene diimide, thiophene, a thiophene derivative, fullerene, a fullerene derivative, or a combination thereof.

The at least one n-type semiconductor material of the first organic photoelectric conversion device and the at least one n-type semiconductor material of the second organic photoelectric conversion device may independently include one or more of fullerene or a fullerene derivative.

The first organic photoelectric conversion device and the second organic photoelectric conversion device may independently include at least one buffer layer of a first buffer layer between the upper electrode and the organic photoelectric conversion layer, or a second buffer layer between the lower electrode and the organic photoelectric conversion layer.

The buffer layer may include a lanthanide element, calcium (Ca), potassium (K), aluminum (Al), or an alloy thereof.

The at least one buffer layer may include a compound represented by Chemical Formula B-1, a compound represented by Chemical Formula B-2, or a combination thereof:

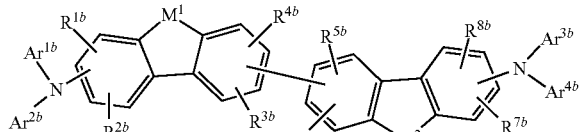

[Chemical Formula B-1]

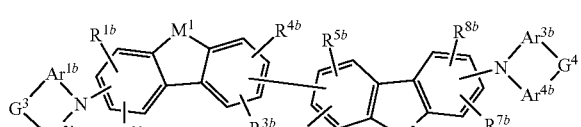

[Chemical Formula B-2]

wherein, in Chemical Formulas B-1 and/or B-2, $M^1$ and $M^2$ are independently $CR^kR^l$, $SiR^mR^n$, $NR^o$, O, S, Se, or Te, $Ar^{1b}$ to $Ar^{4b}$ are independently a substituted or unsubstituted C6 to C30 aryl group or a substituted or unsubstituted C3 to C30 heteroaryl group, $G^3$ and $G^4$ are independently a single bond, $-(CR^pR^q)_{n2}-$, wherein n2 is an integer of 1 or 2, $-O-$, $-S-$, $-Se-$, $-N=$, $-NR^r-$, $-SiR^sR^t-$, or $-GeR^uR^v-$, and $R^{1b}$ to $R^{8b}$ and $R^k$ to $R^v$ are independently hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group.

The first organic photoelectric conversion device and the second organic photoelectric conversion device may be both on a substrate, and the lower electrode of the first organic photoelectric conversion device may be electrically connected to the substrate through a charge transfer conduit. A length of the charge transfer conduit in the vertical direction may be greater than or equal to about 150 nm and less than or equal to about 1500 nm.

A maximum aspect ratio of the charge transfer conduit may be greater than or equal to about 1.0 and less than or equal to about 15.0.

The substrate may not include any silicon-based photodiode.

The image sensor may further include an insulating layer between the first organic photoelectric conversion device and the first optical filter, between the second organic photoelectric conversion device and the first optical filter, between the first organic photoelectric conversion device and the second optical filter, between the second organic photoelectric conversion device and the second optical filter, or a combination thereof.

An image processing apparatus may include the image sensor.

An electronic device may include the image sensor.

According to some example embodiments, an image sensor may include a first partition and a second partition. The first partition may include a blue organic photoelectric conversion device and a first portion of a green organic photoelectric conversion device overlapping the blue organic photoelectric conversion device in a vertical direction extending perpendicular to an upper surface of the green organic photoelectric conversion device. The blue organic photoelectric conversion device may be configured to selectively absorb light in a blue wavelength spectrum and convert the selectively absorbed light in the blue wavelength spectrum into a first electrical signal. The first portion of the green organic photoelectric conversion device may be configured to selectively absorb light in a green wavelength spectrum and convert the selectively absorbed light in the green wavelength spectrum into a second electrical signal. The second partition may include a red organic photoelectric conversion device and a second portion of the green organic photoelectric conversion device overlapping the red organic photoelectric conversion device in the vertical direction. The blue organic photoelectric conversion device and the red organic photoelectric conversion device may overlap in a horizontal direction extending in parallel to the upper surface of the green organic photoelectric conversion device. The red organic photoelectric conversion device may be configured to selectively absorb light in a red wavelength spectrum and convert the selectively absorbed light in the red wavelength spectrum into a third electrical signal. The second portion of the green organic photoelectric conversion device may be configured to selectively absorb light in the green wavelength spectrum and convert the selectively absorbed light in the green wavelength spectrum into a fourth electrical signal. A ratio of a maximum peak external quantum efficiency in the blue wavelength spectrum to a maximum peak external quantum efficiency in the green wavelength spectrum, a ratio of a maximum peak external quantum efficiency in the red wavelength spectrum to the maximum peak external quantum efficiency in the green wavelength spectrum, or both thereof may be greater than or equal to about 0.5.

The blue organic photoelectric conversion device, the green organic photoelectric conversion device, and the red organic photoelectric conversion device may independently include an upper electrode, a lower electrode, and an organic photoelectric conversion layer between the upper electrode and the lower electrode, the organic photoelectric conversion layer including at least one p-type semiconductor material and at least one n-type semiconductor material.

The blue organic photoelectric conversion device, the green organic photoelectric conversion device, and the red organic photoelectric conversion device may independently have a volume ratio of the n-type semiconductor material thereof to the p-type semiconductor material thereof of greater than or equal to about 0.2 and less than or equal to about 2.0.

The at least one p-type semiconductor material of the blue organic photoelectric conversion device may include thiophene, a thiophene derivative, rubrene, a rubrene derivative, tetracene, a tetracene derivative, coumarin, a coumarin derivative, or a combination thereof.

The at least one p-type semiconductor material of the green organic photoelectric conversion device may include a compound represented by Chemical Formula A-1:

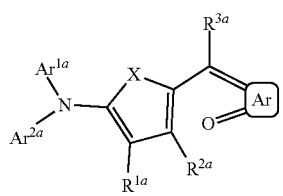

[Chemical Formula A-1]

wherein, in Chemical Formula A-1, X is O, S, Se, Te, SO, $SO_2$, or $SiR^aR^b$, Ar is a substituted or unsubstituted C6 to C30 arylene group, a substituted or unsubstituted C3 to C30 heterocyclic group, or a first fused ring of two or more thereof, $Ar^{1a}$ and $Ar^{2a}$ are independently a substituted or unsubstituted C6 to C30 aryl group or a substituted or unsubstituted C3 to C30 heteroaryl group, $Ar^{1a}$ and $Ar^{2a}$ are independently present or be linked to each other to form a second fused ring, and $R^{1a}$ to $R^{3a}$, $R^a$, and $R^b$ are independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a combination thereof.

The at least one p-type semiconductor material of the red organic photoelectric conversion device may include a metal-phthalocyanine or a metal-phthalocyanine derivative.

The at least one n-type semiconductor material of the blue organic photoelectric conversion device, the at least one n-type semiconductor material of the green organic photoelectric conversion device, and the at least one n-type semiconductor material of the red organic photoelectric conversion device may independently include an organic metal complex, a derivative of an organic metal complex, carboxylic anhydride, a derivative of carboxylic anhydride, perylene diimide, a derivative of perylene diimide, thiophene, a thiophene derivative, fullerene, a fullerene derivative, or a combination thereof.

The n-type semiconductor material of at least one of the blue organic photoelectric conversion device, the green organic photoelectric conversion device, or the red organic photoelectric conversion device may include fullerene or a fullerene derivative.

The blue organic photoelectric conversion device, the red organic photoelectric conversion device, and the green organic photoelectric conversion device may be on a substrate. The lower electrode of the blue organic photoelectric conversion device may be connected to the substrate through a first charge transfer conduit and the lower electrode of the red organic photoelectric conversion device is connected to the substrate through a second charge transfer conduit. Respective lengths of the first charge transfer conduit and the second charge transfer conduit in the vertical direction may be independently greater than or equal to about 50 nm and less than or equal to about 500 nm.

The substrate may not include any silicon-based photodiode.

Maximum aspect ratios of the first charge transfer conduit and the second charge transfer conduit may be independently greater than or equal to about 0.5 and less than or equal to about 10.0.

The image sensor may further include an optical filter between a light incidence side of the image sensor and the red organic photoelectric conversion device, the optical filter being configured to selectively absorb light in the blue wavelength spectrum.

An image processing apparatus may include the image sensor.

An electronic device may include the image sensor.

At least the photoelectric conversion layers of the blue organic photoelectric conversion device and the red organic photoelectric conversion device may be isolated from direct contact with each other in the in-plane direction.

According to some example embodiments, an image sensor may include a first organic photoelectric conversion device and a second organic photoelectric conversion device at least partially overlapping the first organic photoelectric conversion device in a vertical direction that is perpendicular to an upper surface of the first organic photoelectric conversion device. The first organic photoelectric conversion device may be configured to selectively absorb light in a first wavelength spectrum within a visible wavelength spectrum and convert the selectively absorbed light in the first wavelength spectrum into a first electrical signal. The second organic photoelectric conversion device may be configured to selectively absorb light in a second wavelength spectrum within the visible wavelength spectrum and convert the selectively absorbed light in the second wavelength spectrum into a second electrical signal. The second wavelength spectrum may be different from the first wavelength spectrum. The image sensor may have a first partition and a second partition offset from each other along an in-plane direction that is perpendicular to the vertical direction and parallel to the upper surface of the first organic photoelectric conversion device. The first partition may include a first portion of the first organic photoelectric conversion device and a first portion of the second organic photoelectric conversion device, and the second partition may include a second portion of the first organic photoelectric conversion device and a second portion of the second organic photoelectric conversion device. At least one of the first partition or the second partition may include a first optical filter configured to selectively transmit at least light in a third wavelength spectrum within the visible wavelength spectrum and selectively absorb light in at least a portion of at least one of the first wavelength spectrum or the second wavelength spectrum, the third wavelength spectrum being different from the first wavelength spectrum and the second wavelength spectrum, where the first optical filter is between a light incidence surface of the image sensor and the first organic photoelectric conversion device in the vertical direction, or between the first organic photoelectric conversion device and the second organic photoelectric conversion device in the vertical direction.

the second wavelength spectrum may be the visible wavelength spectrum, and the first wavelength spectrum and the third wavelength spectrum may be both within the visible wavelength spectrum, such that the first organic photoelectric conversion device is configured to selectively absorb light in the first wavelength spectrum within the visible wavelength spectrum, and the second organic photoelectric conversion device is under the first organic photoelectric conversion device and is configured to non-selectively absorb light in the visible wavelength spectrum. The first partition may include the first optical filter between the first portions of the first organic photoelectric conversion device and the second organic photoelectric conversion device in the vertical direction, the first optical filter being configured to selectively transmit light in the third wavelength spectrum. The second partition may include a second optical filter between the second portions of the first organic photoelectric conversion device and the second organic photoelectric conversion device in the vertical direction, the second optical filter being configured to selectively transmit light in a fourth wavelength spectrum within the visible wavelength spectrum, the fourth wavelength spectrum being different from each of the first, second, and third wavelength spectrums.

The first wavelength spectrum may be a green wavelength spectrum within the visible wavelength spectrum, the third wavelength spectrum may be a blue wavelength spectrum within the visible wavelength spectrum, and the fourth wavelength spectrum may be a red wavelength spectrum within the visible wavelength spectrum.

The first organic photoelectric conversion device may be under the second organic photoelectric conversion device, the first optical filter may be between the light incidence surface of the image sensor and the second organic photoelectric conversion device in the vertical direction.

The first optical filter may be included in one of the first partition or the second partition and is not included in another one of the first partition or the second partition, such that the first optical filter overlaps the second portions of the first and second organic photoelectric conversion devices in the vertical direction and does not overlap the first portions of the first and second organic photoelectric conversion devices in the vertical direction, or the first optical filter overlaps the first portions of the first and second organic photoelectric conversion devices in the vertical direction and does not overlap the second portions of the first and second organic photoelectric conversion devices in the vertical direction. The first optical filter may be configured to selectively transmit light in both the first and third wavelength spectrums.

The first wavelength spectrum may be a green wavelength spectrum within the visible wavelength spectrum. The second wavelength spectrum may include both a blue wavelength spectrum within the visible wavelength spectrum and a red wavelength spectrum within the visible wavelength spectrum and does not include the green wavelength spectrum. The third wavelength spectrum may be the blue wavelength spectrum or the red wavelength spectrum.

The first optical filter may overlap the first portions of the first and second organic photoelectric conversion devices in the vertical direction and does not overlap the second portions of the first and second organic photoelectric conversion devices in the vertical direction. The second partition may include a second optical filter that overlaps the second portions of the first and second organic photoelectric conversion devices in the vertical direction and does not overlap the first portions of the first and second organic photoelectric conversion devices in the vertical direction. The second optical filter may be configured to selectively transmit light in both the first wavelength spectrum and a fourth wavelength spectrum, the fourth wavelength spectrum being within the visible wavelength spectrum, the fourth wavelength spectrum being different from each of the first to third wavelength spectrums.

The first wavelength spectrum may be a green wavelength spectrum within the visible wavelength spectrum. The second wavelength spectrum may include both a blue wavelength spectrum within the visible wavelength spectrum and a red wavelength spectrum within the visible wavelength spectrum and does not include the green wavelength spectrum. The third wavelength spectrum may be the blue wavelength spectrum. The fourth wavelength spectrum may be the red wavelength spectrum.

The first optical filter may extend through both the first and second partitions, such that the first optical filter overlaps both the first and second portions of both the first organic photoelectric conversion device and the second organic photoelectric conversion device in the vertical direction.

An organic photoelectric conversion material according to some example embodiments not only has a high extinction coefficient, but also may be configured to selectively absorb light in a particular (or, alternatively, predetermined) wavelength spectrum according to a molecular structure thereof. Accordingly, when the organic photoelectric conversion material is applied to (e.g., included in) the image sensor, sensitivity and degree of integration of the image sensor may be improved.

An image sensor having a structure in which a plurality of organic photoelectric conversion devices are stacked may be provided in some example embodiments. An image sensor having improved integration and sensitivity at the same time and/or an image sensor having improved absorption balance between colors may be provided. Such an image sensor may be applied to various electronic devices.

DETAILED DESCRIPTION

Figure 1:
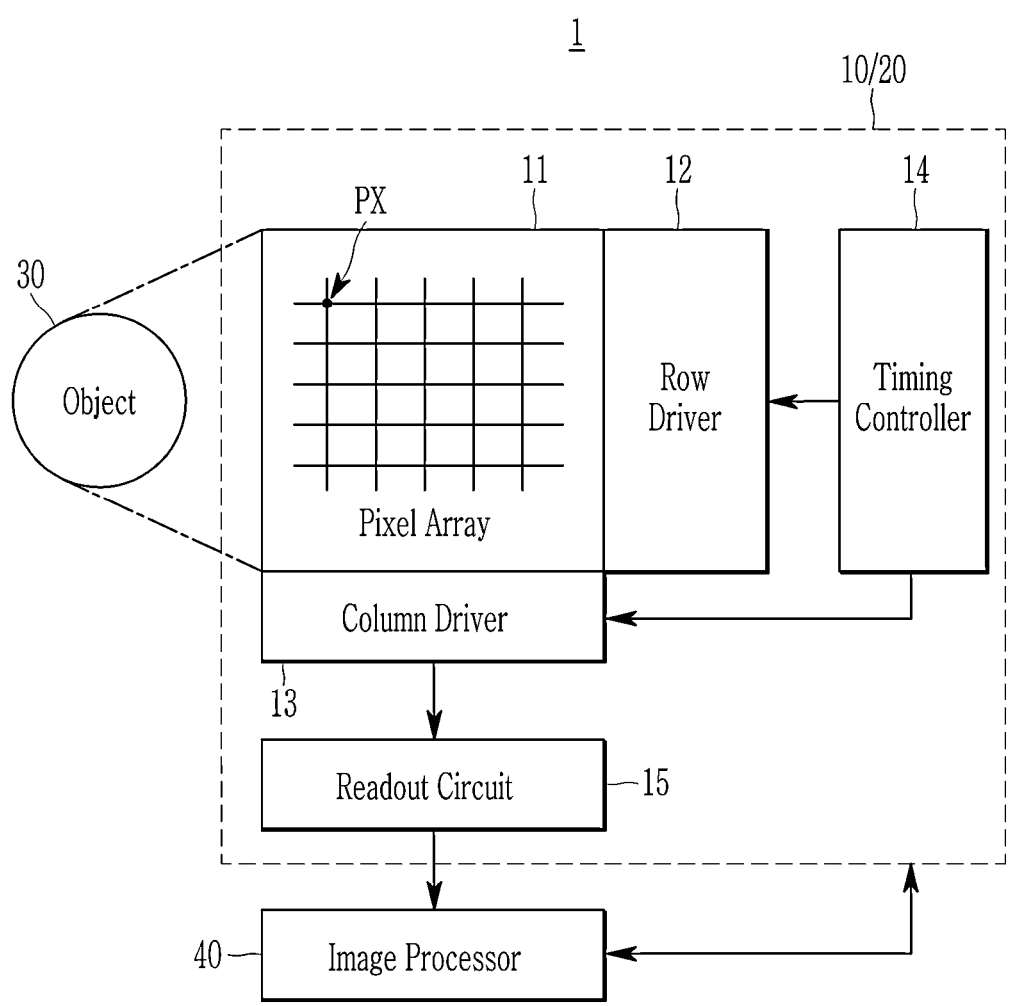
FIG. 1 is a schematic view of an image processing apparatus according to some example embodiments.

The terms used in this specification are used to describe some example embodiments, and are not intended to limit the inventive concepts.

The terms "upper portion" or "on" may include things that are directly above/below/left/right in contact (e.g., direct contact with each other), as well as those that are above/below/left/right in a non-contact manner (e.g., indirectly on each other, also referred to as being on each other but isolated from direct contact with each other by one or more interposing spaces and/or structures). Singular expressions include plural expressions unless the context clearly indicates otherwise.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

An element (e.g., structure, surface, direction, etc.) described as being "in parallel" with another element may be interchangeably referred to as "extending in parallel" with the other element. An element (e.g., structure, surface, direction, etc.) described as being "perpendicular" to another element may be interchangeably referred to as "extending perpendicular" with the other element.

The terms such as "comprise", "include", or "have" are intended to indicate the presence of features, numbers, steps, actions, components, parts, components, materials, or combinations thereof described in the disclosure, unless otherwise specified. Possibility of the presence or addition of, one or more other features, or numbers, steps, actions, components, parts, components, materials, or combinations thereof, is not precluded.

The terms such as "first," "second," and "third" may be used to describe various elements, but are used to distinguish one element from other elements, and the orders, types, etc. of the elements are not limited. In addition, terms such as "unit," "means," "module," " . . . unit" refer to a unit of a comprehensive configuration that processes a certain function or operation, which may be implemented as hardware or software, or a combination of hardware and software.

Hereinafter, the term "metal" includes a metal and a semimetal. As used herein, when a definition is not otherwise provided, "substituted" refers to replacement of a hydrogen atom of a compound or a group by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when a definition is not otherwise provided, "hetero" refers to one including 1 to 4 heteroatoms selected from N, O, S, Se, Te, Si, and P.

As used herein, when a definition is not otherwise provided, "combination" refers to a mixture of two or more and a stacked structure of two or more.

Hereinafter, some example embodiments are described with reference to the accompanying drawings. In the following drawings, the same reference numerals refer to the same constituent elements, and the dimension (width, thickness, etc. of layers, regions, etc.) of each constituent element in the drawings may be exaggerated for clarity and convenience of description. Meanwhile, the example embodiments described below are merely examples, and various modifications may be possible from these example embodiments.

According to some example embodiments, an image sensor and an image processing apparatus including organic photoelectric conversion devices may be provided.

FIG. 1 is a schematic view illustrating an image processing apparatus according to some example embodiments. Specifically, the image processing apparatus 1 may include an image sensor 10 and an image processor 40. The image sensor 10 may be operated according to a control command of the image processor 40, and the image sensor 10 may convert light (e.g., incident light that is incident on at least a portion of the image sensor 10) reflected or transmitted from the object 30 into an electrical signal and output the electrical signal to the image processor 40.

The image sensor 10 may include a pixel array 11, a row driver 12, a column driver 13, a timing controller 14, a readout circuit 15, and the like.

The pixel array 11 may include a plurality of pixels PXs. The pixels PXs may include an organic photoelectric conversion device (e.g., an organic photodiode) configured to receive (e.g., absorb) light and generate charges (e.g., based on absorbing said light).

The row driver 12 may drive the pixel array 11 in a row unit. For example, the row driver 12 may generate a transmission control signal configured to control a transfer transistor of each pixel PX, a reset control signal configured to control a reset transistor, a selection control signal configured to control a selection transistor, and the like.

The column driver 13 may include a correlated double sampler CDS, an analog-to-digital converter ADC, or the like. The correlated double sampler CDS may perform correlated double sampling by receiving signals from pixels PXs included in a row selected by a row selection signal supplied by the row driver 12. The analog-to-digital converter ADC may convert the output of the correlated double sampler into a digital signal and transmit the digital signal to the readout circuit 15.

The readout circuit 15 may include a latch or a buffer circuit that may temporarily store digital signals and an amplifying circuit. The readout circuit 15 may temporarily store or amplify the digital signal received from the column driver 13 to generate image data. Operation timings of the row driver 12, the column driver 13, and the readout circuit 15 may be determined by the timing controller 14.

The timing controller 14 may operate by a control command transmitted from the image processor 40. The image processor 40 may process image data transmitted by the readout circuit 15 and output it to a display device or store it in a storage device such as a memory.

The image processing apparatus 1, and/or any portions thereof (including, without limitation, the image sensor 10, the row driver 12, the column driver 13, the timing controller 14, the readout circuit 15, the image processor 40, and/or a combination thereof) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device, for example a solid state drive (SSD), storing a program of instructions, and a processor (e.g., CPU) configured to execute the program of instructions to implement the functionality and/or methods performed by some or all of the image processing apparatus 1 and/or any portion thereof (including, for example, the image sensor 10, the image processor 40, and/or a combination thereof).

According to some example embodiments, the image sensor 10 may have a stacked structure in which organic photoelectric conversion devices are stacked in two parts. The organic photoelectric conversion device(s) may increase the sensitivity and integration of the image sensor 10, and may be implemented with a thinner thickness (e.g., in a vertical direction) and a smaller area (e.g., in horizontal direction(s) perpendicular to the vertical direction) than a silicon photodiode, so that more circuit design space may be secured in the image sensor 10 and various functional designs of the image sensor 10 may be possible. Accordingly, the performance, efficiency, compactness, or a combination thereof, of the image sensor 10 and/or any device including the image sensor 10 may be improved. The image sensor 10 may be a CMOS image sensor.

Figure 2:
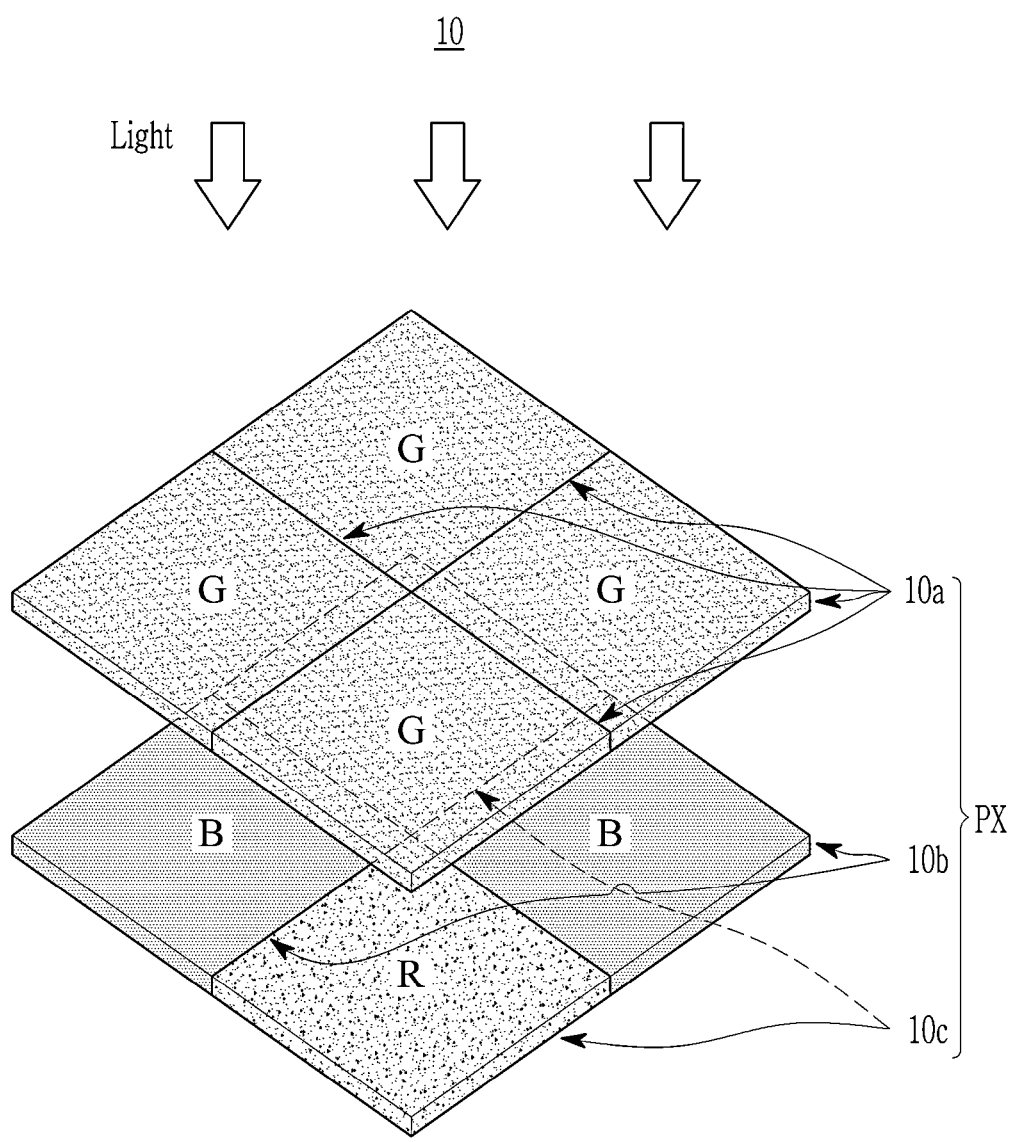
FIG. 2 is a schematic view showing a plane of an image sensor according to some example embodiments.

FIG. 2 is a plan view illustrating a pixel array of an image sensor (e.g., image sensor 10 as shown in FIG. 1) according to some example embodiments.

Referring to FIG. 2, the pixel array of the image sensor 10 includes, for example, a unit pixel group repeatedly arranged along a row and/or column, and each unit pixel group includes a plurality of pixels PXs. For example, the plurality of pixels PXs may include a first pixel 10a disposed at the light incident side and configured to selectively detect light in a first wavelength spectrum, and a second pixel 10b configured to selectively detect light in a second wavelength spectrum, and a third pixel 10c configured to selectively detect light in a third wavelength spectrum, and the second pixel 10b and the third pixel 10c may be disposed on the same plane (along an in-plane direction) under the first pixel 10a. As shown in FIG. 2, the plurality of pixels PX may include one or multiple first pixels 10a, one or multiple second pixels 10b, and/or one or more third pixels 10c. The first wavelength spectrum, the second wavelength spectrum, and the third wavelength spectrum may be different wavelength spectra from one another within visible wavelength spectrum and may constitute three primary colors of green, blue, and red. For example, the first wavelength spectrum may be a green wavelength spectrum (e.g., a wavelength spectrum of about 500 nm to about 600 nm), the second wavelength spectrum is a blue wavelength spectrum (e.g., a wavelength spectrum of greater than or equal to about 380 nm and less than about 500 nm), and a third wavelength spectrum may be a red wavelength spectrum (e.g., a wavelength spectrum greater than about 600 nm and less than or equal to about 700 nm). Where the first wavelength spectrum is a green wavelength spectrum, for example, it will be understood that the first organic photoelectric conversion device 100 may be configured to selectively absorb light in the green wavelength spectrum and convert the selectively absorbed light in the green wavelength spectrum into the first electrical signal. However, it will be understood that the first organic photoelectric conversion device may be configured to selectively absorb other, separate wavelength spectra.

The image sensor 10 may have a stacked structure in which a first organic photoelectric conversion device configured to selectively absorb light in at least a part of a visible wavelength spectrum (e.g., a first wavelength spectrum within the visible wavelength spectrum) and convert it (the selectively absorbed light in the first wavelength spectrum) into an electrical signal (e.g., a first electrical signal), and a second organic photoelectric conversion device configured to non-selectively absorb light in the visible wavelength spectrum (e.g., absorb any or all light within the visible wavelength spectrum) and convert it (the non-selectively absorbed light) into an electrical signal (e.g., a second electrical signal) are stacked (e.g., are stacked in a direction that is perpendicular to the direction(s) in which the organic photoelectric conversion devices extend in parallel to each other) in two parts.

Figure 3:
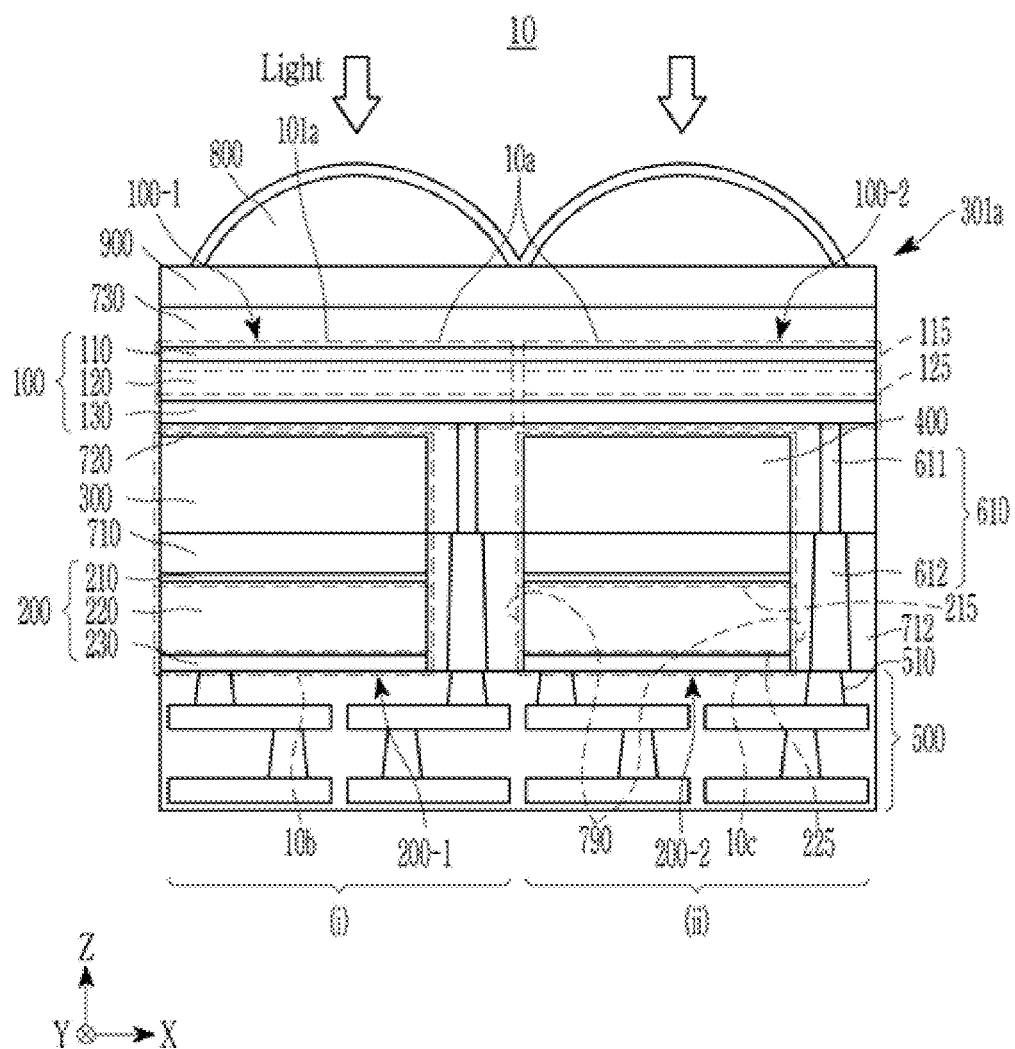
FIG. 3 is a schematic view showing a cross section of an image sensor according to some example embodiments.

FIG. 3 shows a cross-sectional view of this image sensor 10 (e.g., the image sensor 10 shown in FIG. 2) according to some example embodiments.

Referring to FIG. 3, in the image sensor 10, a first organic photoelectric conversion device 100 and a second organic photoelectric conversion device 200 are sequentially disposed from a light incident side (e.g., light incidence surface 301a). As shown in FIG. 3, the first and second organic photoelectric conversion devices 100 and 200 are sequentially disposed (e.g., stacked) in a vertical direction Z that extends perpendicular to an upper surface 101a of the first organic photoelectric conversion device 100. Accordingly, as shown in FIG. 3, the second organic photoelectric conversion device 200 may be under the first organic photoelectric conversion device 100 such that the first organic photoelectric conversion device 100 at least partially or completely overlaps the second organic photoelectric conversion device 200 in the vertical direction Z that is perpendicular to an upper surface 101a of the first organic photoelectric conversion device 100.

A first optical filter 300 and a second optical filter 400 are between the first organic photoelectric conversion device 100 and the second organic photoelectric conversion device 200, respectively (e.g., in the vertical direction Z), at the same plane (along an in-plane direction including, for example, the first horizontal direction X and/or the second horizontal direction Y that each extend perpendicular to the vertical direction Z and parallel to an upper surface 101a of the first organic photoelectric conversion device 100). For example, as shown in FIG. 3, the first and second optical filters 300 and 400 may each overlap separate, respective portions of the first and second organic photoelectric conversion devices 100 and 200 in the vertical direction Z, and the first and second optical filters 300 and 400 may overlap each other (e.g., may be coplanar) in the first horizontal direction X and/or the second horizontal direction Y. The first optical filter 300 may be configured to selectively transmit (e.g., filter) light in the second wavelength spectrum and the second optical filter 400 may be configured to selectively transmit light in the third wavelength spectrum. In other words, the image sensor 10 may include a first partition (i) including the first organic photoelectric conversion device 100, the second organic photoelectric conversion device 200, and the first optical filter 300 between the first organic photoelectric conversion device 100 and the second organic photoelectric conversion device 200 in the vertical direction Z, and a second partition (ii) including the first organic photoelectric conversion device 100, the second organic photoelectric conversion device 200, and the second optical filter 400 between the first organic photoelectric conversion device 100 and the second organic photoelectric conversion device 200 in the vertical direction Z. The first partition (i) and the second partition (ii) may be arranged along an in-plane direction (e.g., the first horizontal direction X and/or the second horizontal direction Y).

As shown in at least FIGS. 2 and 3, the first and second partitions (i) and (ii), which may also be referred to herein interchangeably as first and second regions (i) and (ii), of the image sensor 10 may be offset from and/or adjacent to each other in one or more horizontal directions X and/or Y (e.g., in-plane direction).

In some example embodiments, the first and second organic photoelectric conversion devices 100 and 200 may each be a single organic photoelectric conversion device that extends in the in-plane direction between multiple partitions, where separate portions of the single organic photoelectric conversion device may at least partially define separate pixels, said separate portions may be at least partially defined by overlap with one or more other structures (e.g., optical filter(s)) in the vertical direction Z.

As shown in FIG. 3, the first partition (i) may include at least a first portion 100-1 of the first organic photoelectric conversion device 100, at least a first portion 200-1 of the second organic photoelectric conversion device 200, and a first optical filter 300 between the first portions 100-1 and 200-1 of the first and second organic photoelectric conversion devices 100 and 200 in the vertical direction Z. The first optical filter 300 may be configured to selectively transmit light in a second wavelength spectrum within the visible wavelength spectrum, where the second wavelength spectrum being different from the first wavelength spectrum that the first organic photoelectric conversion device 100 is configured to selectively absorb.

As shown in FIG. 3, the second partition (i) may include at least a second portion 100-2 of the first organic photoelectric conversion device 100, at least a second portion 200-2 of the second organic photoelectric conversion device 200, and a second optical filter 400 between the second portions 100-2 and 200-2 of the first and second organic photoelectric conversion device 100 and 200 in the vertical direction Z. The second optical filter 400 may be configured to selectively transmit light in a third wavelength spectrum within the visible wavelength spectrum, the third wavelength spectrum being different from both the first wavelength spectrum and the second wavelength spectrum.

As shown in FIG. 3, the first and second portions 100-1 and 100-2 of the first organic photoelectric conversion device 100 may be separate portions of the first organic photoelectric conversion device 100 that are offset from each other in the first and/or second horizontal directions X and/or Y and include separate portions of the upper electrode 110, lower electrode 130, and organic photoelectric conversion layer 120.

As shown in FIG. 3, the first and second portions 200-1 and 200-2 of the second organic photoelectric conversion device 200 may be separate portions of the second organic photoelectric conversion device 200 that are offset from each other in the first and/or second horizontal directions X and/or Y and include separate portions of the upper electrode 210, lower electrode 230, and organic photoelectric conversion layer 220.

Referring to FIGS. 2 and 3, the first organic photoelectric conversion device 100 may constitute (e.g., may comprise) a first pixel 10a, and a combination of the first optical filter 300 and the second organic photoelectric conversion device 200 (e.g., at least a portion of second organic photoelectric conversion device 200 that overlaps the first optical filter 300 in the vertical direction Z) may constitute a the second pixel 10b, and a combination of the second optical filter 400 and the second organic photoelectric conversion device 200 (e.g., at least a portion of second organic photoelectric conversion device 200 that overlaps the second optical filter 400 in the vertical direction Z) may constitute the third pixel 10c.

As shown in FIG. 3, the first and second organic photoelectric conversion devices 100 and 200 may each independently include upper electrodes 110 and 210 and lower electrodes 130 and 230, and a first organic photoelectric conversion layer 120 and a second organic photoelectric conversion layer 220 between the respective upper and lower electrodes of the first and second organic photoelectric conversion devices 100 and 200. Restated, and as shown in FIG. 3, the first organic photoelectric conversion device 100 and the second organic photoelectric conversion device 200 may independently include an upper electrode (110 and 120, respectively), a lower electrode (130 and 230, respectively), and an organic photoelectric conversion layer between the upper electrode and the lower electrode (120 and 220, respectively).

One of the upper electrode 110 or the lower electrode 130 is an anode and the other is a cathode. One of the upper electrode 210 or the lower electrode 230 is an anode and the other is a cathode. For example, the lower electrodes 130 and 230 may be anodes and the upper electrodes 110 and 210 may be cathodes, or the lower electrodes 130 and 230 may be cathodes and the upper electrodes 110 and 210 may be anodes.

The upper electrodes 110 and 210 and/or the lower electrodes 130 and 230 may be transparent electrodes. A transparent electrode according to some example embodiments may have high transmittance of greater than or equal to about 80%, and may include an oxide conductor, a carbon conductor, and/or a metal thin film. For example, the oxide conductor may include indium tin oxide (ITO), indium zinc oxide (IZO), zinc tin oxide (ZTO), aluminum tin oxide (ATO), aluminum zinc oxide (AZO), zinc oxide (ZnO), tin oxide (SnO), and/or fluorine doped tin oxide (FTO), the carbon conductor may include graphene and/or carbon nanomaterial, and the metal thin film may include aluminum (Al), magnesium (Mg), silver (Ag), gold (Au), an alloy thereof, or a combination thereof.

The upper electrodes 110 and 210 or the lower electrodes 130 and 230 may be light-receiving electrodes disposed at the light incident surface side. FIG. 3 shows an example in which the upper electrodes 110 and 210 are light receiving electrodes. One of the upper electrode 110 or the lower electrode 130 may be a common electrode, and the other may be a pixel electrode. One of the upper electrode 210 or the lower electrode 230 may be a common electrode, and the other may be a pixel electrode. A particular (or, alternatively, predetermined) voltage may be applied to the upper electrodes 110 and 210 or the lower electrodes 130 and 230 through a wiring (not shown), and as a result, an electric field may be formed between the upper electrode 110 and the lower electrode 130 and between the upper electrode 210 and the lower electrode 230. In addition, the upper electrodes 110 and 210 and/or the lower electrodes 130 and 230 may be electrodes for collecting electric charges generated in the organic photoelectric conversion layers 120 and 220.

The first organic photoelectric conversion layer 120 may be configured to selectively absorb light (e.g., incident light) in the first wavelength spectrum within a visible wavelength spectrum and convert it (the selectively absorbed light in the first wavelength spectrum) into an electrical signal. Specifically, the first organic photoelectric conversion layer 120 may have a maximum absorption wavelength ($\lambda_{a,max}$) within the first wavelength spectrum, and an absorption spectrum in the first wavelength spectrum may be higher than the absorption spectrum in other wavelength spectra. For example, an area of the absorption spectrum in the first wavelength spectrum may be greater than or equal to about 70%, greater than or equal to about 75%, greater than or equal to about 80%, greater than or equal to about 85%, greater than or equal to about 90%, or greater than or equal to about 95% of the total area of the absorption spectrum and may be equal to or less than 100% of the total area of the absorption spectrum.

The second organic photoelectric conversion layer 220 may be configured to non-selectively absorb light (e.g., incident light) in the visible wavelength spectrum (e.g., absorb light in any or all wavelengths in the visible wavelength spectrum) and convert light (e.g., the absorbed light) into an electrical signal. Specifically, the second organic photoelectric conversion layer 220 may exhibit absorption characteristics for light in the entire visible wavelength spectrum, that is, light absorption characteristics over a full wavelength spectrum of about 380 nm to about 700 nm (which may be referred to herein as the visible wavelength spectrum). For example, the second organic photoelectric conversion layer 220 may exhibit a higher absorption spectrum of a wavelength spectrum of greater than or equal to about 380 nm and less than or equal to about 700 nm than an absorption spectrum of a wavelength spectrum of less than about 380 nm and/or an absorption spectrum of a wavelength spectrum of greater than about 700 nm. Specifically, the absorption spectrum area of the visible wavelength spectrum (e.g., greater than or equal to about 380 nm and less than or equal to about 700 nm) may be greater than or equal to about 70%, greater than or equal to about 75%, greater than or equal to about 80%, greater than or equal to about 85%, greater than or equal to about 90%, or greater than or equal to about 95% of the total area of the absorption spectrum and may be equal to or less than 100% of the total area of the absorption spectrum.

The second organic photoelectric conversion layer 220 may include a light absorbing material configured to absorb light in the entire visible light region (e.g., the entire visible wavelength spectrum), or may include light absorbing materials configured to absorb light in different wavelength spectrums, respectively. For example, the second organic photoelectric conversion layer 220 may be a mixture of a light absorbing material configured to absorb light in a blue wavelength spectrum, a light absorbing material configured to absorb light in a green wavelength spectrum, and a light absorbing material configured to absorb light in a red wavelength spectrum.

In some example embodiments, the first and second organic photoelectric conversion layers 120 and 220 may have a same total material composition and thus may be configured to absorb light in a same wavelength spectrum.

The first and second organic photoelectric conversion layers 120 and 220 may receive incident light to generate excitons, and then separate the generated excitons into holes and electrons. The organic photoelectric conversion layers 120 and 220 may each include at least one p-type semiconductor material and at least one n-type semiconductor material to form a pn junction. In some example embodiments, the organic photoelectric conversion layers 120 and 220 may each include the same or different at least one p-type semiconductor material and the same or different at least one n-type semiconductor material to form a pn junction. At least one of the p-type semiconductor material or the n-type semiconductor material may be an organic material. For example, the p-type semiconductor material may be an organic material. For example, each of the p-type semiconductor material and the n-type semiconductor material may be an organic material, respectively. The p-type semiconductor material and/or the n-type semiconductor material may be a light absorbing material, and may have a maximum peak absorption wavelength ($\lambda_{max}$) in the same or different wavelength spectra.

The p-type semiconductor material may have a HOMO energy level of greater than or equal to about 4.0 eV, greater than or equal to about 4.1 eV, or greater than or equal to about 4.2 eV, and less than or equal to about 6.0 eV, less than or equal to about 5.9 eV, or less than or equal to about 5.8 eV. In addition, the p-type semiconductor material may have a LUMO energy level of greater than or equal to about 1.8 eV, greater than or equal to about 1.9 eV, or greater than or equal to about 2.0 eV, and less than or equal to about 4.0 eV, less than or equal to about 3.9 eV, or less than or equal to about 3.8 eV. The p-type semiconductor material may have an energy band gap of less than or equal to about 2.4 eV, less than or equal to about 2.3 eV, or less than or equal to about 2.2 eV, and greater than or equal to about 1.8 eV, greater than or equal to about 1.9 eV, or greater than or equal to about 2.0 eV.

The first and second organic photoelectric conversion layers 120 and 220 may each independently include a compound having a maximum absorption wavelength ($\lambda_{a, max}$) in a green wavelength spectrum as a p-type semiconductor material. Specifically, the p-type semiconductor material may have a maximum absorption wavelength ($\lambda_{a, max}$) in a wavelength spectrum of greater than or equal to about 500 nm or greater than or equal to about 520 nm, and less than or equal to about 600 nm, or less than or equal to about 580 nm. The compound may have a higher absorption spectrum in a wavelength spectrum of greater than or equal to about 500 nm, or greater than or equal to about 520 nm, and less than or equal to about 600 nm, or less than or equal to about 580 nm than that of other wavelength spectrums. For example, an absorption spectrum area in the wavelength spectrum of greater than or equal to about 500 nm or greater than or equal to about 520 nm, and less than or equal to about 600 nm, or less than or equal to about 580 nm may be greater than or equal to about 70%, greater than or equal to about 75%, greater than or equal to about 80%, greater than or equal to about 85%, greater than or equal to about 90%, or greater than or equal to about 95% of the total area of the absorption spectrum.

The p-type semiconductor materials of the first and second organic photoelectric conversion layers 120 and 220 may each independently include a compound represented by Chemical Formula A.

EDM1-LM1-EAM1            [Chemical Formula A]

In Chemical Formula A,
EDM1 may be an electron donating moiety,
EAM1 may be an electron accepting moiety,
LM1 may be a π-conjugated linking moiety that links the electron donating moiety to the electron accepting moiety.

The p-type semiconductor material may be a compound represented by Chemical Formula A-1.

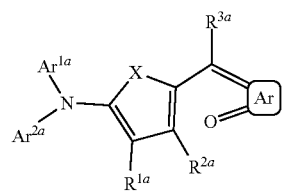

[Chemical Formula A-1]

In Chemical Formula A-1,
X may be O, S, Se, Te, SO, $SO_2$, or $SiR^aR^b$,
Ar may be a substituted or unsubstituted C6 to C30 arylene group, a substituted or unsubstituted C3 to C30 heterocyclic group, or a fused ring of the foregoing two or more (e.g., a first fused ring of two or more thereof),
$Ar^{1a}$ and/or $Ar^{2a}$ may be independently a substituted or unsubstituted C6 to C30 aryl group or a substituted or unsubstituted C3 to C30 heteroaryl group,
$Ar^{1a}$ and $Ar^{2a}$ may be independently present or be linked to each other to form a fused ring (e.g., a second fused ring), and
$R^{1a}$ to $R^{3a}$, $R^a$ and $R^b$ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a combination thereof.

For example, $Ar^{1a}$ and $Ar^{2a}$ may independently be a substituted or unsubstituted phenyl group, a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyridazinyl group, a substituted or unsubstituted pyrimidinyl group, a substituted or unsubstituted pyrazinyl group, a substituted or unsubstituted quinolinyl group, a substituted or unsubstituted isoquinolinyl group, a substituted or unsubstituted naphthyridinyl group, a substituted or unsubstituted cinnolinyl group, a substituted or unsubstituted quinazolinyl group, a substituted or unsubstituted phthalazinyl group, a substituted or unsubstituted benzotriazinyl group, a substituted or unsubstituted pyridopyrazinyl group, a substituted or unsubstituted pyridopyrimidinyl group, or a substituted or unsubstituted pyridopyridazinyl group.

$Ar^{1a}$ and $Ar^{2a}$ may be linked to each other to form a ring. For example, $Ar^{1a}$ and $Ar^{2a}$ may be linked through a single bond, —$(CR^cR^d)_{n1}$— (n1 is an integer of 1 or 2), —O—, —S—, —Se—, —N=, —$NR^e$—, —$SiR^fR^g$—, or —$GeR^hR^i$— to form a ring. Herein, $R^c$ to $R^i$ may independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, a cyano group, or a combination thereof.

Specifically, the p-type semiconductor material may include one or more of the compounds represented by any one of Chemical Formulas A-2 to A-9.

[Chemical Formula A-2]

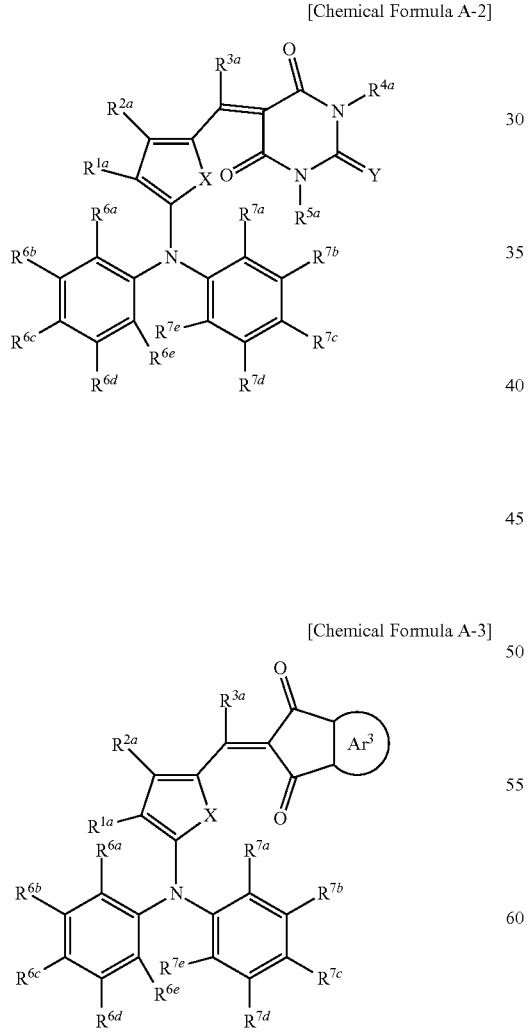

[Chemical Formula A-3]

[Chemical Formula A-4]

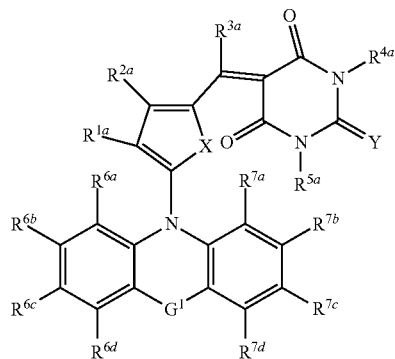

[Chemical Formula A-5]

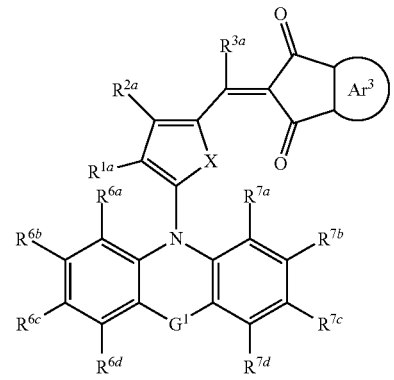

[Chemical Formula A-6]

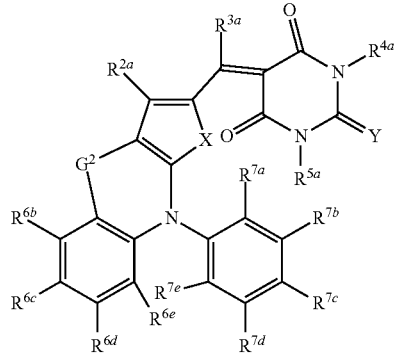

[Chemical Formula A-7]

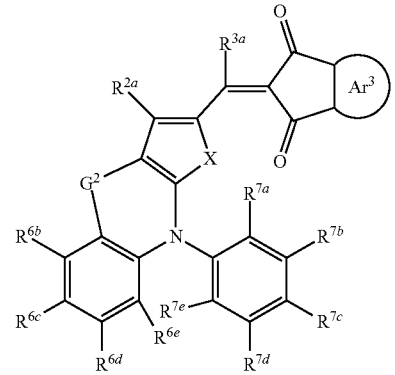

23
-continued

[Chemical Formula A-8]

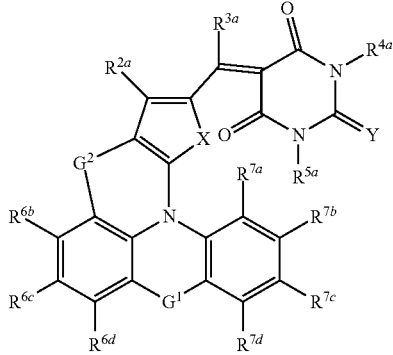

[Chemical Formula A-9]

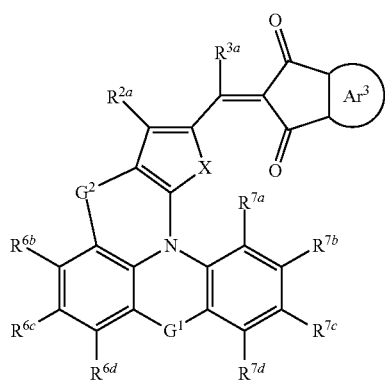

In Chemical Formulas A-2 to A-9,

X may be O, S, Se, Te, SO, $SO_2$, or $SiR^aR^b$, $Ar^3$ may be a substituted or unsubstituted C6 to C30 arylene group, a substituted or unsubstituted C3 to C30 heterocyclic group, or a fused ring of the foregoing two or more (e.g., a first fused ring of two or more thereof), $R^{1a}$ to $R^{5a}$, $R^a$ and $R^b$ may independently be one of hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a combination thereof, $G^1$ and/or $G^2$ may independently be a single bond, —$(CR^cR^d)_{n1}$— (n1 is an integer of 1 or 2), —O—, —S—, —Se—, —N=, —$NR^e$—, —$SiR^fR^g$—, or —$GeR^hR^i$—, wherein $R^c$ to $R^i$ are independently hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, a cyano group, or a combination thereof, wherein $R^c$ and $R^d$, $R^f$ and $R^g$, and $R^h$ and $R^i$ may independently be present or may be linked to each other to form a ring, Y may be O, S, Se, Te, or C($R^j$)(CN), wherein $R^j$ is hydrogen, a cyano group (—CN), or a C1 to C10 alkyl group, $R^{6a}$ to $R^{6e}$ and $R^{7a}$ to $R^{7e}$ may independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a combination thereof, and

24

$R^{1a}$ to $R^{3a}$, $R^{6a}$ to $R^{6e}$, and $R^{7a}$ to $R^{7e}$ may independently be present or adjacent two thereof may be linked to each other to form a fused ring (e.g., a second fused ring).

For example, $Ar^3$ of Chemical Formulas A-3, A-5, A-7, and/or A-9 may be benzene ring, naphthalene ring, anthracene ring, thiophene ring, selenophene ring, tellurophene ring, pyridine ring, pyrimidine ring, or fused rings of two or more selected from foregoing rings.

The n-type semiconductor material may have an LUMO energy level of greater than or equal to about 3.3 eV, greater than or equal to about 3.4 eV, greater than or equal to about 3.5 eV, and less than or equal to about 4.7 eV, less than or equal to about 4.6 eV, or less than or equal to about 4.5 eV, and a HOMO energy level of greater than or equal to about 5.3 eV, greater than or equal to about 5.4 eV, greater than or equal to about 5.5 eV, and less than or equal to about 6.7 eV, less than or equal to about 6.6 eV, or less than or equal to about 6.5 eV.

The n-type semiconductor material of the first and second organic photoelectric conversion layers 120 and 220 may have excellent charge mobility. For example, the n-type semiconductor materials of the first and second organic photoelectric conversion layers 120 and 220 may each independently have a charge mobility of greater than or equal to about $1.0 \times 10^{-10}$ $Cm^2/V \cdot s$, greater than or equal to about $1.0 \times 10^{-9}$ $Cm^2/V \cdot s$, greater than or equal to about $1.0 \times 10^{-8}$ $Cm^2/V \cdot s$, greater than or equal to about $1.0 \times 10^{-7}$ $Cm^2/V \cdot s$, and less than or equal to about $1.0 \times 10^{-3}$ $Cm^2/V \cdot s$, less than or equal to about $1.0 \times 10^{-2}$ $Cm^2/V \cdot s$, less than or equal to about $1.0 \times 10^{-1}$ $Cm^2/V \cdot s$, or less than or equal to about 1.0 $Cm^2/V \cdot s$.

The n-type semiconductor materials of the first and second organic photoelectric conversion layers 120 and 220 may each independently be one or more of an organic metal complex such as tris(8-hydroxyquinolinato)aluminum $Alq_3$; subphthalocyanine SubPc, or phthalocyanine Pc, or a derivative thereof; carboxylic anhydrides such as 1,4,5,8-naphthalenetetracarboxylic dianhydride NTCDA or a derivative thereof; perylene diimide such as N,N'-bis(2,6-dimethylphenyl) perylene-3,4,9,10-tetracarboxylic diimide, or a derivative thereof; thiophene or a thiophene derivative; fullerene such as $C_{60}$, $C_{70}$, $C_{78}$, or $C_{80}$, a fullerene derivative; or a combination thereof.

The first and second organic photoelectric conversion layers 120 and 220 may be a single layer or a plurality of layers. Specifically, the first and second organic photoelectric conversion layers 120 and 220 may each independently be an intrinsic layer (1 layer) or various combinations such as a p-type layer/1 layer, an 1 layer/n-type layer, a p-type layer/1 layer/n-type layer, a p-type layer/n-type layer, and the like.

The first organic photoelectric conversion layer 120 and the second organic photoelectric conversion layer 220 may include a p-type semiconductor material and an n-type semiconductor material of an appropriate type and/or content (volume or thickness) according to a desired absorption wavelength spectrum. Specifically, both the first organic photoelectric conversion layer 120 and the second organic photoelectric conversion layer 220 may include a p-type semiconductor material configured to absorb light in a green wavelength spectrum, but by including an n-type semiconductor material of different types and/or contents (volumes or thicknesses), light in different absorption wavelength spectra (e.g., absorption wavelength spectrums of green and visible lights, respectively) may be absorbed. For example, the second organic photoelectric conversion layer 220 may include more n-type semiconductor materials than the first organic photoelectric conversion layer 120. The content of the n-type semiconductor material (for example, fullerene (C60)) of the second organic photoelectric conversion layer 220 may be about 1.0 time or more, about 2.0 times or more, about 3.0 times or more, about 3.5 times or more, about 4.0 times or more, and about 100.0 times or less, about 70.0 times or less, about 50.0 times or less, about 30.0 times or less, about 20.0 times or less, about 17.0 times or less, about 15.0 times or less, or about 12.0 times or less of the content of the n-type semiconductor material (for example, fullerene (C60)) of the first organic photoelectric conversion layer 120 (e.g., between about 1.0 time and about 100.0 times).

The first organic photoelectric conversion layer 120 may have a volume ratio of the n-type semiconductor material to the p-type semiconductor material (thickness ratio when implemented as a plurality of layers) of greater than or equal to about 0.2 and less than or equal to about 2.0. For example, the volume ratio of the n-type semiconductor material to the p-type semiconductor material may be greater than or equal to about 0.3, greater than or equal to about 0.5, greater than or equal to about 0.7, greater than or equal to about 0.9, greater than or equal to about 1.0, greater than or equal to about 1.2 and less than or equal to about 2.0, less than or equal to about 1.8, or less than or equal to about 1.6.

The second organic photoelectric conversion layer 220 may have a volume ratio of the n-type semiconductor material to the p-type semiconductor material (thickness ratio when implemented as a plurality of layers) of greater than or equal to about 2.0 and less than or equal to about 20.0. For example, the volume ratio (thickness ratio) of the n-type semiconductor material to the p-type semiconductor material may be greater than or equal to about 2.5, greater than or equal to about 3.0, greater than or equal to about 3.5, greater than or equal to about 4.5 and less than or equal to about 15.0, or less than or equal to about 10.0.

The first and second organic photoelectric conversion layers 120 and 220 may each independently have a thickness (e.g., in the vertical direction Z) of greater than or equal to about 10 nm, greater than or equal to about 30 nm, greater than or equal to about 50 nm, greater than or equal to about 100 nm, greater than or equal to about 150 nm, or greater than or equal to about 200 nm, and less than or equal to about 1000 nm, less than or equal to about 800 nm, less than or equal to about 500 nm, less than or equal to about 300 nm, less than or equal to about 250 nm, or less than or equal to about or 200 nm. The thickness of the second organic photoelectric conversion layer 220 may be greater than the thickness of the first organic photoelectric conversion layer 120. For example, the thickness of the second organic photoelectric conversion layer 220 may be greater than or equal to about 100 nm, greater than or equal to about 150 nm, or greater than or equal to about 200 nm, and less than or equal to about 1000 nm or less than or equal to about 800 nm.

As shown in FIG. 3, the first and second organic photoelectric conversion devices 100 and 200 may each independently further include a respective buffer layer 115, 125, 215, and/or 225 between the upper electrodes 110 and 210 and the organic photoelectric conversion layers 120 and 220 and/or between the lower electrodes 130 and 230 and the organic photoelectric conversion layers 120 and 220. Restated, each of the first and second organic photoelectric conversion devices 100 and 200 may include at least one buffer layer of a first buffer layer 115, 215 between the upper electrode 110, 210 and the organic photoelectric conversion layer 120, 220, or a second buffer layer 125, 225, between the lower electrode 130, 230 and the organic photoelectric conversion layer 120, 220.

Each of the buffer layers may independently be a hole transport layer, a hole injection layer, a hole extraction layer, an electron blocking layer, an electron transport layer, an electron injection layer, an electron extraction layer, a hole blocking layer, or a combination thereof. For example, the buffer layer 115, 125, 215, and/or 225 may effectively transfer or extract holes and electrons separated from the organic photoelectric conversion layers 120 and 220 to the lower electrodes 130 and 230 and the upper electrodes 110 and 210, respectively. In addition, the buffer layer 115, 125, 215, and/or 225 may block reverse injection or transfer of the charge from the upper electrodes 110 and 210 and/or the lower electrodes 130 and 230 to the organic photoelectric conversion layers 120 and 220 when an external voltage is applied.

The buffer layer may include an inorganic material or an organic material. The inorganic buffer layer may include, for example, a lanthanide element, calcium Ca, potassium K, aluminum Al, or an alloy thereof. The lanthanide element may include ytterbium Yb. The organic buffer layer may include, for example, a low molecular semiconductor, a polymer semiconductor, or a combination thereof having higher charge mobility than the organic photoelectric conversion layers 120 and 220.

The charge mobility of the organic buffer layer may be about 50 times higher than those of the organic photoelectric conversion layers 120 and 220. Specifically, the charge mobility of the organic buffer layer may be greater than or equal to about $1.0 \times 10^{-3}$ cm$^2$/Vs, greater than or equal to about $1.5 \times 10^{-3}$ cm$^2$/Vs, or greater than or equal to about $2.0 \times 10^{-3}$ cm$^2$/Vs and less than or equal to about 10 cm$^2$/Vs.

The organic buffer layer may include a compound represented by Chemical Formula B-1 and/or B-2.

[Chemical Formula B-1]

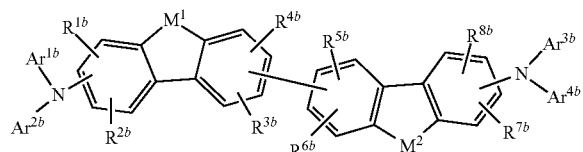

[Chemical Formula B-2]

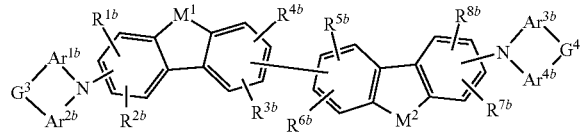

In Chemical Formulas B-1 and/or B-2,
M$^1$ and M$^2$ may independently be CR$^k$R$^l$, SiR$^m$R$^n$, NR$^o$, O, S, Se, or Te,
Ar$^{1b}$ to Ar$^{4b}$ may independently be a substituted or unsubstituted C6 to C30 aryl group or a substituted or unsubstituted C3 to C30 heteroaryl group,
G$^3$ and/or G$^4$ may independently be a single bond, —(CR$^p$R$^q$)$_{n2}$— (n2 is an integer of 1 or 2), —O—, —S—, —Se—, —N=, —NR$^r$—, —SiR$^s$R$^t$—, or —GeR$^u$R$^v$—, and
R$^{1b}$ to R$^{8b}$ and R$^k$ to R$^v$ may independently be hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group.

Specifically, the organic buffer layer may include a compound represented by Chemical Formula B-3 and/or B-4.

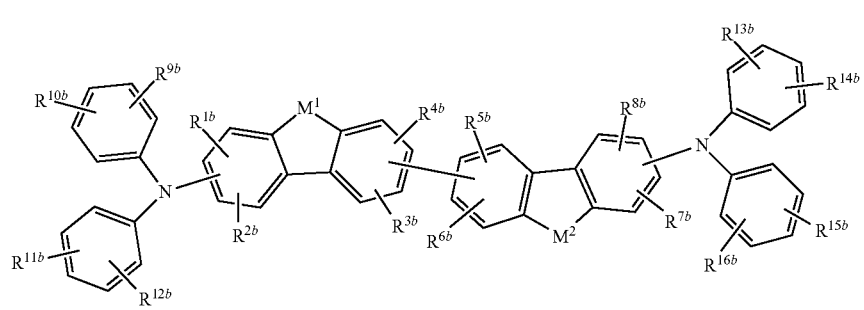

[Chemical Formula B-3]

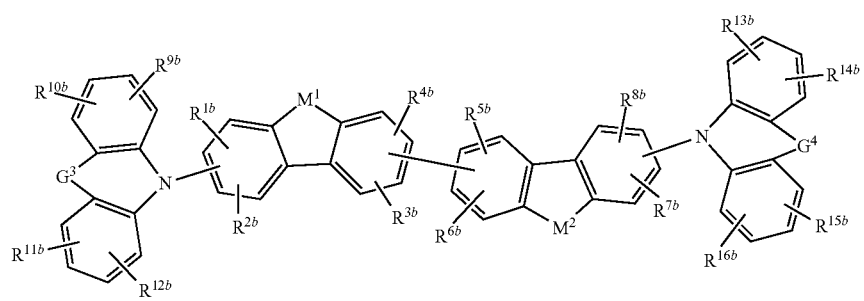

[Chemical Formula B-4]

In Chemical Formula B-3 or B-4, $M^1$, $M^2$, $G^3$, $G^4$, and $R^{1b}$ to $R^{8b}$ are the same as described above for Chemical Formula B-1 and/or B-2, and $R^{9b}$ to $R^{16b}$ are independently the same as the definition of $R^{1b}$ above for Chemical Formula B-1 and/or B-2.

For example, the organic buffer layer may include a compound represented by Chemical Formula B-5 and/or B-6.

In Chemical Formula B-5 or B-6, $R^{9b}$ to $R^{16b}$ are independently the same as the definition of $R^{1b}$ above for Chemical Formula B-1 and/or B-2-and $R^{k1}$ to $R^{l2}$ are independently the same as the definition of $R^k$ above for Chemical Formula B-1 and/or B-2.

In addition, different types of materials may be applied depending on the location of the buffer layer. For example, the buffer layer in contact with the n-type layer of the organic photoelectric conversion layers 120 and 220 may include bathocuproine BCP or LiF, and the buffer layer in

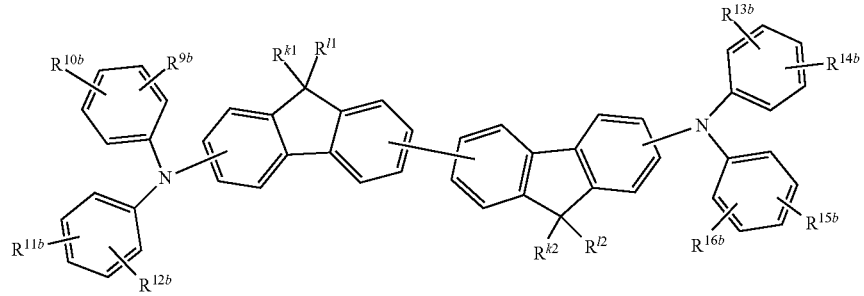

[Chemical Formula B-5]

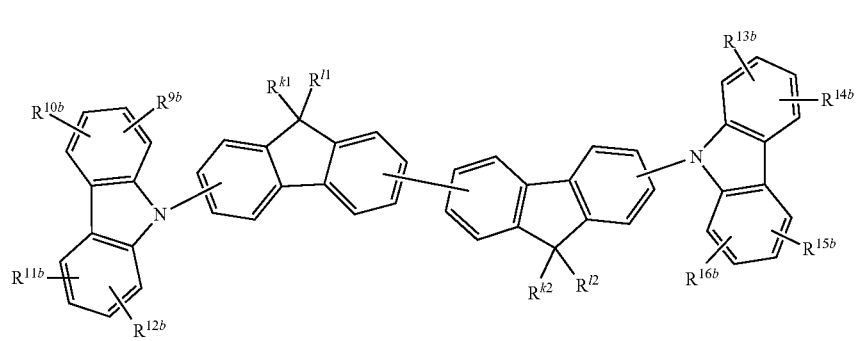

[Chemical Formula B-6]

contact with the p-type layer of the organic photoelectric conversion layers 120 and 220 may include PEDOT (poly (3,4-ethylenedioxythiophene)) or PSS (poly(styrene sulfonate)).

The first and second organic photoelectric conversion devices 100 and 200 may each independently have a thickness of greater than or equal to about 50 nm, greater than or equal to about 80 nm, greater than or equal to about 100 nm, and less than or equal to about 1500 nm, less than or equal to about 1200 nm, less than or equal to about 1000 nm, less than or equal to about 800 nm, or less than or equal to about 500 nm. The thickness of the second organic photoelectric conversion device 200 may be greater than the thickness of the first organic photoelectric conversion device 100.

The first optical filter 300 may be configured to selectively transmit light including at least a second wavelength spectrum and the second optical filter 400 may be configured to selectively transmit light including at least a third wavelength spectrum, respectively. The first, second, and third wavelength spectra may be different wavelength spectra, including different wavelength spectra that at least partially overlap or do not overlap at all. For example, the first wavelength spectrum may be a green wavelength spectrum, the second wavelength spectrum may be a blue wavelength spectrum, and the third wavelength spectrum may be a red wavelength spectrum. In some example embodiments, when the first wavelength spectrum includes the green wavelength spectrum, the first organic photoelectric conversion device 100 may be configured to selectively absorb light in a green wavelength spectrum. The first optical filter 300 may be configured to selectively transmit light in at least the blue wavelength spectrum. Additionally or alternatively, the second optical filter may be configured to selectively transmit light in at least the red wavelength spectrum.

Herein, the selectively transmitting light including the second wavelength spectrum may mean selectively transmitting light in the second wavelength spectrum or selectively transmitting light in the second wavelength spectrum and the first wavelength spectrum.

Herein, the selectively transmitting light including the third wavelength spectrum may mean selectively transmitting light in the third wavelength spectrum or selectively transmitting light in the third wavelength spectrum and the first wavelength spectrum.

Specifically, the first optical filter 300 may have a maximum transmission wavelength ($\lambda_{t,max}$) in the second wavelength spectrum, and an absorption spectrum of the second wavelength spectrum may be lower than those of other wavelength spectrums. For example, an absorption spectrum area of the second wavelength spectrum may be less than or equal to about 30%, less than or equal to about 25%, less than or equal to about 20%, less than or equal to about 15%, less than or equal to about 10%, or less than or equal to about 5% of the total area of the absorption spectrum. The second optical filter 400 may have a maximum transmission wavelength ($\lambda_{t,max}$) in the third wavelength spectrum, and an absorption spectrum in the third wavelength spectrum may be lower than those in other wavelength spectra. For example, an absorption spectrum area of the third wavelength spectrum may be less than or equal to about 30%, less than or equal to about 25%, less than or equal to about 20%, less than or equal to about 15%, less than or equal to about 10%, or less than or equal to about 5% of the total area of the absorption spectrum.

The maximum absorption wavelength of the first organic photoelectric conversion device 100, the maximum transmission wavelength of the first optical filter 300, and the maximum transmission wavelength of the second optical filter 400 may be different from each other. For example, the maximum absorption wavelength of the first organic photoelectric conversion device may be in a green wavelength spectrum (wavelength spectrum of greater than or equal to about 500 nm or greater than or equal to about 520 nm and less than or equal to about 600 nm, or less than or equal to about 580 nm), the maximum transmission wavelength of the first optical filter 300 may be in a blue wavelength spectrum (a wavelength spectrum of greater than or equal to about 380 nm or greater than or equal to about 400 nm and less than or equal to about 520 nm, less than or equal to about 500 nm, or less than or equal to about 480 nm), and the maximum transmission wavelength of the second optical filter 400 may be in a red wavelength spectrum (a wavelength spectrum of greater than or equal to about 580 nm or greater than or equal to about 600 nm, and less than or equal to about 700 nm or less than or equal to about 680 nm). As another example, the maximum absorption wavelength of the first organic photoelectric conversion device 100, the maximum transmission wavelength of the first optical filter 300, and the maximum transmission wavelength of the second optical filter 400 may each independently be in a magenta wavelength spectrum, a cyan wavelength spectrum, and/or a yellow wavelength spectrum.

The first and second organic photoelectric conversion devices 100 and 200 may be disposed on the substrate 500. The substrate 500 may be an organic semiconductor material, an inorganic semiconductor material, a flexible substrate, glass, or a combination thereof. For example, the substrate 500 may include a semiconductor material such as Si, Ge, SiGe, or a Group III-V material. For example, the first partition (i) and the second partition (ii) may be arranged side by side along the in-plane direction of the substrate 500, and the first partition (i) and the second partition (ii) may be repeatedly arranged along rows and/or columns along the in-plane direction to form an array.

In some example embodiments, the first pixels 10a may be defined in the X-Y plane to be separate portions of the first organic photoelectric conversion device 100 that all have a same area in the X-Y plane. In some example embodiments, the second and third pixels 10b and 10c may be defined in the X-Y plane by the respective lateral surfaces of the first and second optical filters 300 and 400. In some example embodiments, the boundaries of the first and second partitions (i) and (ii) may be defined in the X-Y plane so that each partition (i) and/or (ii) includes a single first pixel 10a and a single one of the second or third pixels 10b or 10c and thus one of the first or second optical filters 300 or 400, and the boundaries of the first and second partitions (i) and (ii) may be further defined in the X-Y plane so that the X-Y boundaries of the respective partitions match the X-Y boundaries of the first pixels 10a included therein, so that the first pixels 10a have same dimensions and area in the X-Y plane. In some example embodiments, the boundaries of the first and second partitions (i) and (ii) may be defined in the X-Y plane by lateral (e.g., vertical sidewall) surfaces of the respective optical filters 300 and/or 400 in the respective partitions.

As shown in FIG. 3, where the first organic photoelectric conversion device 100 and the second organic photoelectric conversion device 200 are on the substrate 500, the lower electrode 130 of the first organic photoelectric conversion device 100 and the substrate 500 may be electrically connected through a charge transfer path 610, also referred to as a charge transfer conduit. A length of the charge transfer path 610 may be greater than or equal to about 150 nm and less than or equal to about 1500 nm. For example, the length of the charge transfer path 610 (e.g., in the vertical direction Z) may be greater than or equal to about 170 nm, greater than or equal to about 200 nm, greater than or equal to about 220 nm, greater than or equal to about 250 nm, and less than or equal to about 1400 nm, less than or equal to about 1300 nm, less than or equal to about 1200 nm, less than or equal to about 1100 nm, less than or equal to about 1000 nm, less than or equal to about 900 nm, or less than or equal to about 800 nm. In addition, a maximum aspect ratio of the charge transfer path 610 may be greater than or equal to about 1.0 and less than or equal to about 15.0. For example, the maximum aspect ratio of the charge transfer path 610 may be greater than or equal to about 1.5, greater than or equal to about 2.0, greater than or equal to about 2.5, greater than or equal to about 3.0, and less than or equal to about 14.0, less than or equal to about 13.0, less than or equal to about 12.0, less than or equal to about 11.0, less than or equal to about 10.0, less than or equal to about 9.0, or less than or equal to about 8.0. An average aspect ratio of the charge transfer path 610 may be greater than or equal to about 2.0 and less than or equal to about 10.0. For example, the average aspect ratio of the charge transfer path 610 may be greater than or equal to about 2.5, greater than or equal to about 3.0 and less than or equal to about 9.0 or less than or equal to about 8.0. The maximum aspect ratio of the charge transfer path 610 is a ratio of the maximum length and the minimum width, and the average aspect ratio is a ratio of the average length and the average width. The charge transfer path 610 may be formed as one structure, or two or more charge transfer path structures 611 and 612 may be electrically connected to each other to form the charge transfer path 610. The image sensor according to some example embodiments may have a smaller length and aspect ratio of a charge transfer path than an image sensor including a silicon photodiode.

As shown, the second organic photoelectric conversion device 200 may include one or more holes 790 extending therethrough in the vertical direction Z, and the charge transfer paths 610 may extend through separate, respective holes 790 through the second organic photoelectric conversion device 200 to connect the first organic photoelectric conversion device 100 to the substrate through the second organic photoelectric conversion device 200. As further shown, the portions of the holes 790 not occupied by the charge transfer paths 610 may be filled with an insulating material to form one or more insulating layers 712 which may be separate intermediate insulating layers 712 in separate holes 790.

The substrate 500 may include a pixel circuit 510. The pixel circuit 510 may include a transfer transistor, a driving transistor, a selection transistor, and a reset transistor. The pixel circuit 510 may be electrically connected to the first organic photoelectric conversion device 100 through the charge transfer path 610, and may directly contact the second organic photoelectric conversion device 200.

The substrate 500 may not include a separate photo-detecting device such as a silicon-based photodiode. Restated, the substrate 500 may not include any separate photo-detecting device (e.g., may not include any silicon-based photodiode).Since a space occupied by the silicon-based photodiode in the substrate 500 is unnecessary, the arrangement of constituent elements in the substrate 500 may be free (e.g., not constrained or defined by the presence of silicon-based photodiodes in the substrate 500). For example, additional arrangement of circuits for each pixel may be possible, and various circuit designs may also be possible.

In addition, metal wires (not shown) and pads (not shown) may be formed on the substrate 500. The metal wire and the pad may include a metal having a low specific resistance, such as aluminum (Al), copper (Cu), silver (Ag), and an alloy thereof in order to reduce signal delay.

The image sensor 10 may further include an insulating layer, namely a lower insulating layer 710, an intermediate insulating layer 712, an interlayer insulating layer 720, and an upper insulating layer 730, on the first organic photoelectric conversion device 100, between the first organic photoelectric conversion device 100 and the optical filters 300 and 400, within hole(s) 790, and/or between the second organic photoelectric conversion device 200 and the optical filters 300 and 400. The insulating layers 710, 712, 720, and 730 may include an inorganic insulating material or a low-K material. For example, the inorganic insulating material may be silicon oxide and/or silicon nitride, and the low dielectric constant (low K) material may be SiC, SiCOH, SiCO, SiOF, or a combination thereof. The interlayer insulating layer 720 between the first organic photoelectric conversion device 100 and the optical filters 300 and 400 may have a structure in which the lower electrode 130 of the first organic photoelectric conversion device 100 is buried. Also, the upper insulating layer 730 and/or the lower insulating layer 710 may be a thin-film encapsulation layer that blocks moisture and/or oxygen from the outside.

The image sensor 10 may further include a focusing lens 800. The focusing lens 800 may be on the first organic photoelectric conversion device 100 and may concentrate light into a single point by controlling a direction of incident light. The focusing lens 800 may be disposed for each pixel or may be disposed over a plurality of pixels (e.g., may at least partially or completely overlap one or more pixels in the vertical direction Z). The focusing lens 800 may have a cylindrical shape or a hemispherical shape.

A transparent layer 900 may be further included between the first organic photoelectric conversion device 100 and the focusing lens 800. The transparent layer 900 may be an anti-reflection layer that is disposed at a side where light is incident (e.g., light incidence surface 301a) and may lower reflectivity of incident light, thereby further improving light absorption, and may include a material having a refractive index of about 1.6 to about 2.5. The transparent layer 900 may include a metal oxide, a metal sulfide, and/or an organic material. For example, the transparent layer 900 may include a metal oxide such as an aluminum-containing oxide, a molybdenum-containing oxide, a tungsten-containing oxide, a vanadium-containing oxide, a rhenium-containing oxide, a niobium-containing oxide, a tantalum-containing oxide, a titanium-containing oxide, a nickel-containing oxide, a copper-containing oxide, a cobalt-containing oxide, a manganese-containing oxide, a chromium-containing oxide, a tellurium-containing oxide, or a combination thereof; a metal sulfide such as zinc sulfide; or an organic material such as an amine derivative.

According to some example embodiments, an image sensor has a structure in which organic photoelectric conversion devices are stacked in two parts and has an improved absorption balance between colors without an optical filter (color filter).

Figure 4A:
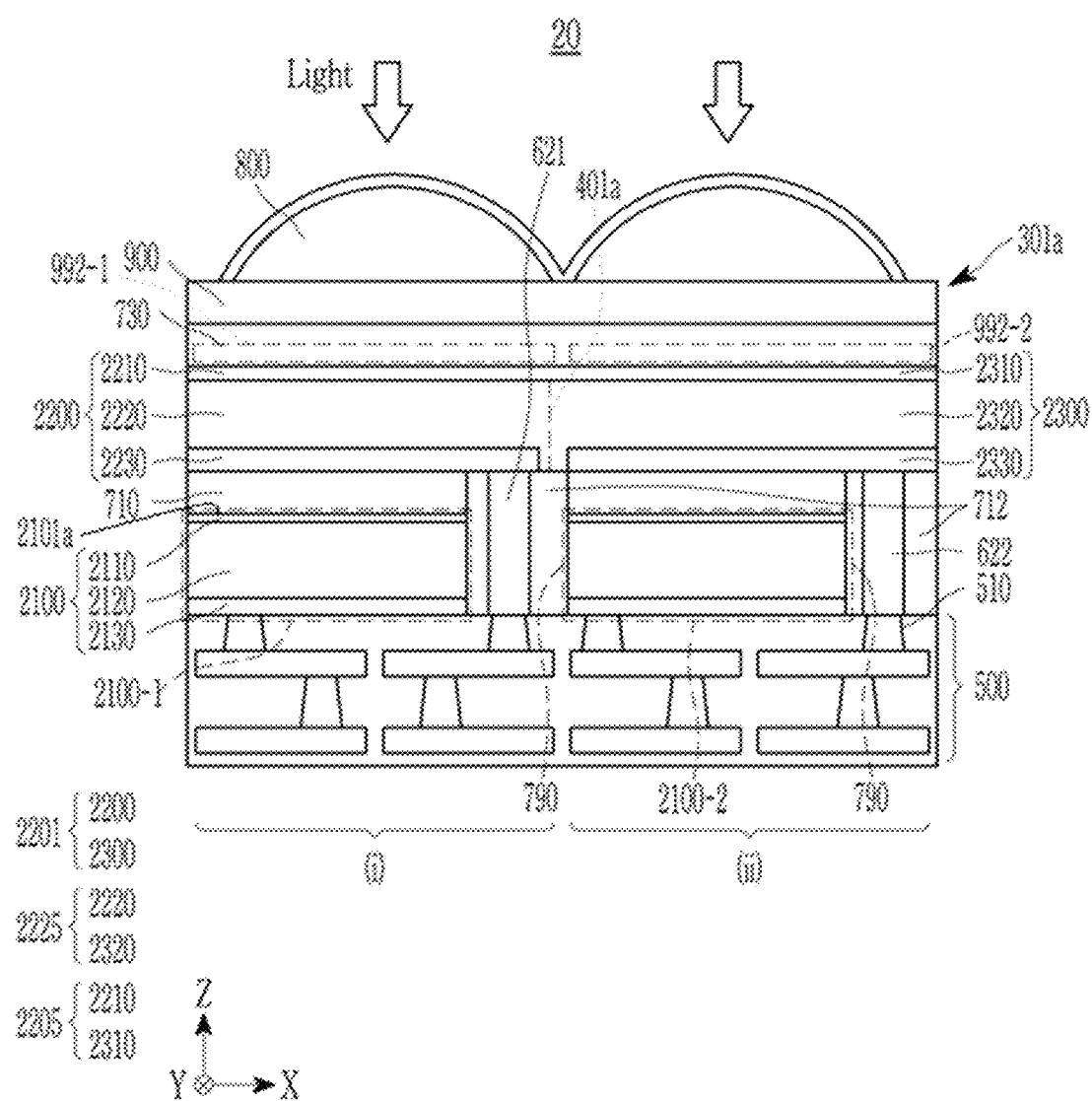
FIG. 4A is a schematic view showing a cross section of an image sensor according to some example embodiments.
Figure 4B:
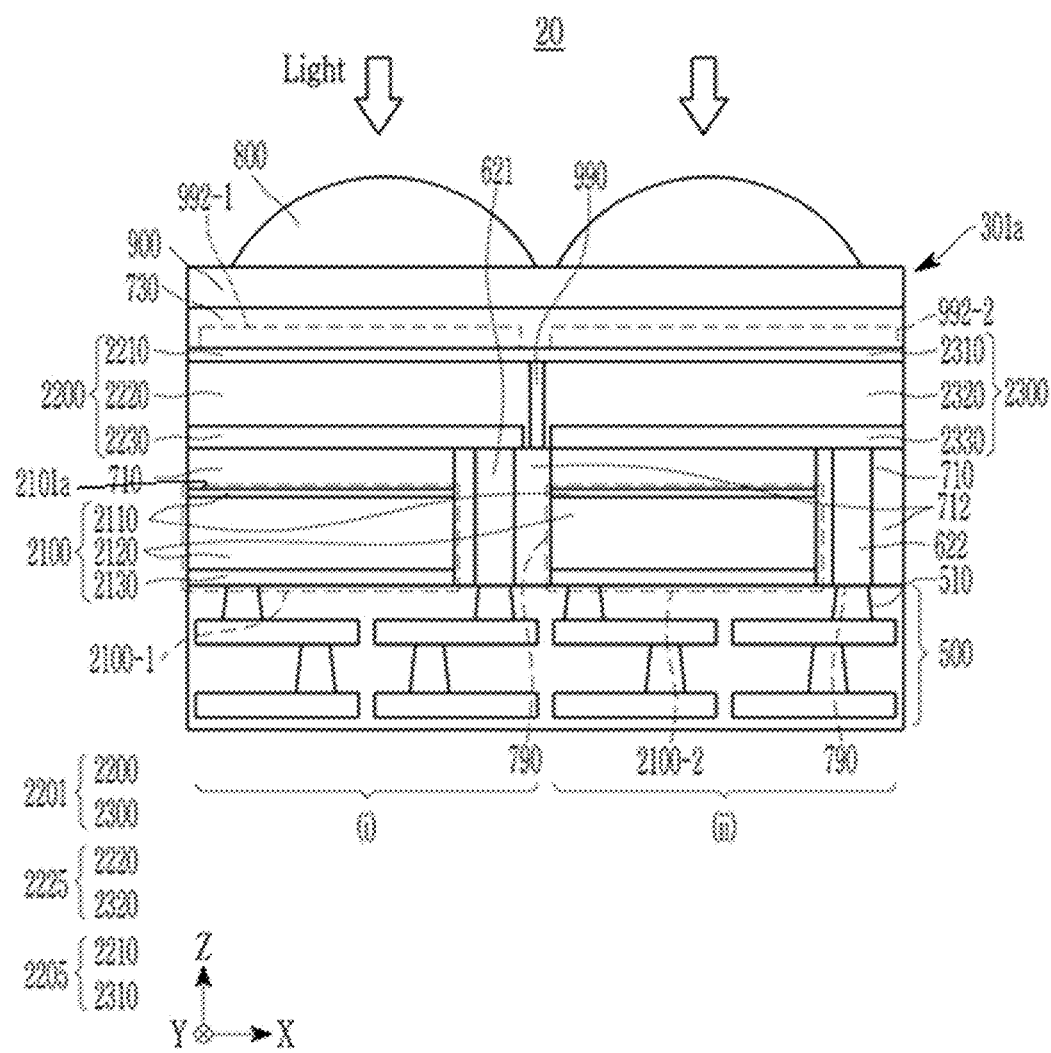
FIG. 4B is a schematic view showing a cross section of an image sensor according to some example embodiments.

FIG. 4A is a schematic view showing a cross section of an image sensor according to some example embodiments. FIG. 4B is a schematic view showing a cross section of an image sensor according to some example embodiments.

Referring to FIGS. 4A and 4B, an image sensor 20, which may be included in the image processing apparatus 1 in place of the image sensor 10, may include a blue organic photoelectric conversion device 2200 configured to selectively absorb light in a blue wavelength spectrum and convert it (the selectively absorbed light in the blue wavelength spectrum) into an electric signal and a red organic photoelectric conversion device 2300 configured to selectively absorb light in a red wavelength spectrum and convert it (the selectively absorbed light in the red wavelength spectrum) into an electrical signal on the same plane (along in-plane direction, e.g., first and/or second horizontal directions X and/or Y) at the light incidence side, and a green organic photoelectric conversion device 2100 configured to selectively absorb light in a green wavelength spectrum and convert it (the selectively absorbed light in the green wavelength spectrum) into an electrical signal under (e.g., overlapping in the vertical direction Z) each of a blue organic photoelectric conversion device 2200 and a red organic photoelectric conversion device 2300.

In other words, the image sensor 20 includes a first partition (i) in which the blue organic photoelectric conversion device 2200 and the green organic photoelectric conversion device 2100 are sequentially disposed from the light incident surface, and a second partition (ii) in which the red organic photoelectric conversion device 2300 and the green organic photoelectric conversion device 2100 are sequentially disposed from the light incident surface. The boundaries of the first and second partitions (i) and (ii) may be defined in the X-Y plane (e.g., first and/or second horizontal directions X and/or Y) at least in part by the interface 401a between adjacent lateral surfaces of the blue and red organic photoelectric conversion devices 2200 and 2100 in the first and/or second horizontal directions X and/or Y.

As shown in FIGS. 4A and 4B, the green organic photoelectric conversion device 2100 may be a single organic photoelectric conversion device extending through multiple partitions (i) and (ii) and having holes 790 extending therethrough, where the green organic photoelectric conversion device 2100 is defined to have first and second portions 2100-1 and 2100-2 that are included in separate, respective partitions (i) and (ii) and overlap separate, respective blue or red organic photoelectric conversion devices 2200 or 2300.

Accordingly, for example as shown in FIGS. 4A and 4B, the image sensor 20 may include a first partition (i) including a blue organic photoelectric conversion device 2200 and a first portion 2100-1 of a green organic photoelectric conversion device 2100 that overlaps the blue organic photoelectric conversion device in a vertical direction Z extending perpendicular to an upper surface 2101a of the green organic photoelectric conversion device 2100, and a second partition (ii) including a red organic photoelectric conversion device 2300 and a second portion 2100-2 of the green organic photoelectric conversion device 2100 that overlaps the red organic photoelectric conversion device 2300 in the vertical direction Z, where the partitions, and thus the blue organic photoelectric conversion device 2200 and the red organic photoelectric conversion device 2300 are offset from each other in a horizontal direction extending in parallel to the upper surface 2101a of the green organic photoelectric conversion device 2100 (e.g., the first and/or second horizontal directions X and/or Y). The blue organic photoelectric conversion device 2200 may be configured to selectively absorb light in a blue wavelength spectrum and convert the selectively absorbed light in the blue wavelength spectrum into a first electrical signal, the first portion 2100-1 of the green organic photoelectric conversion device 2100 may be configured to selectively absorb light in a green wavelength spectrum and convert the selectively absorbed light in the green wavelength spectrum into a second electrical signal, the red organic photoelectric conversion device 2300 may be configured to selectively absorb light in a red wavelength spectrum and convert the selectively absorbed light in the red wavelength spectrum into a third electrical signal, and the second portion 2100-2 of the green organic photoelectric conversion device 2100 may be configured to selectively absorb light in the green wavelength spectrum and convert the selectively absorbed light in the green wavelength spectrum into a fourth electrical signal.

In some example embodiments, the blue and red organic photoelectric conversion devices 2200 and 2300 may include separate, respective blue and red organic photoelectric conversion layers 2220 and 2320 that are direct contact with each other in the first and/or second horizontal directions X and/or Y such that the respective lateral surfaces of adjacent blue and red organic photoelectric conversion devices 2200 and 2300 are in direct contact with each other at interface 401a. However, example embodiments are not limited thereto. In some example embodiments, the blue and red organic photoelectric conversion layers 2220 and 2320 may be separate portions of a single organic photoelectric conversion layer 2225 that extends between the first and second partitions (i) and (ii), such that the blue and red organic photoelectric conversion devices 2200 and 2300 include separate, respective portions of the single organic photoelectric conversion layer 2225. The respective, blue and red organic photoelectric conversion devices 2200 and 2300 may include the separate, respective optical filters 992-1 and 992-2 that overlap the respective portions of the single organic photoelectric conversion layer, where the optical filter 992-1 may selectively transmit light in at least the blue and green wavelength regions (e.g., selectively absorb red light) and the optical filter 992-2 may selectively transmit light in at least the red and green wavelength regions (e.g., selectively absorb blue light), to configure the blue and red organic photoelectric conversion devices 2200 and 2300 to selectively absorb and photoelectrically convert light in the blue and red wavelength spectrums, respectively.

It will be understood that, in FIGS. 4A and 4B, one or both of the optical filters 992-1 and 992-2 may be absent. For example, the image sensor 20 may include the optical filter 992-2 in the second partition (ii) and not the optical filter 992-1 in the first partition (i). In some example embodiments, the image sensor 20 may include a single optical filter 992-1 or 992-2 that extends between both the first and second partitions (i) and (ii) so that separate portions of the single optical filter 992-1 or 992-2 are included in each of the blue and red organic photoelectric conversion devices 2200 and 2300.

In FIG. 4B, at least the respective blue and red organic photoelectric conversion layers 2220 and 2320 of the blue and red organic photoelectric conversion devices 2200 and 2300 may be isolated from direct contact with each other in the first and/or second horizontal directions X and/or Y (e.g., in the in-plane direction) by one or more insulating layers 990. Said blue and red organic photoelectric conversion devices 2200 and 2300 may share a common electrode 2205 (e.g., a single-piece common electrode 2205 where the upper electrodes 2210 and 2310 are separate portions of the common electrode 2205), but, example embodiments are not limited thereto, and in some example embodiments, for example, the respective upper electrodes 2210 and 2310 of the blue and red organic photoelectric conversion devices 2200 and 2300 may be isolated from direct contact with each other in the first and/or second horizontal directions X and/or Y by one or more insulating layers, which may be a same or different insulating layer as an insulating layer 990 that isolates the blue and red organic photoelectric conversion layers 2220 and 2320 from direct contact with each other in the first and/or second horizontal directions X and/or Y.

Figure 5:
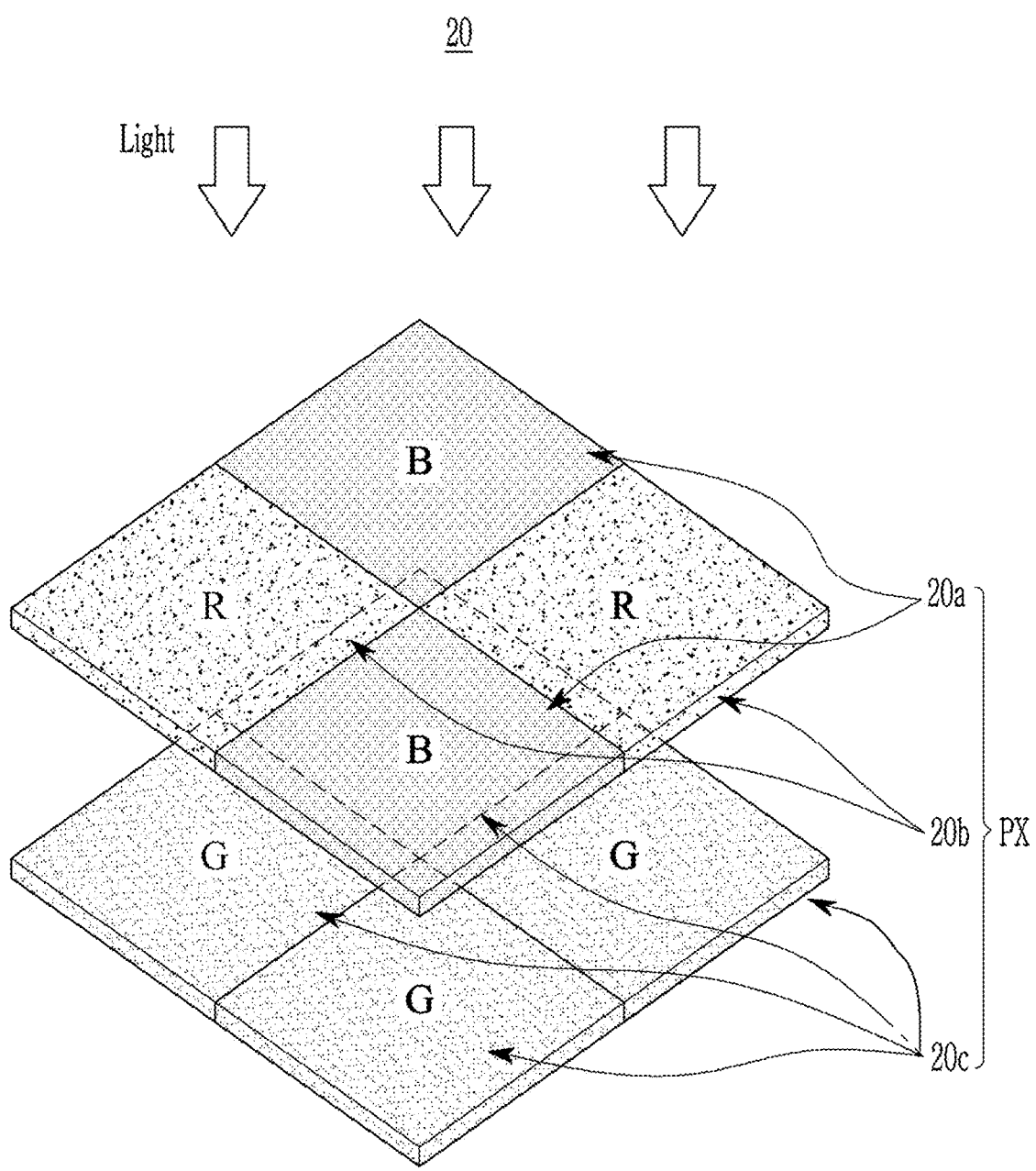
FIG. 5 is a schematic view showing a plane of an image sensor according to some example embodiments.

Referring to FIGS. 4A and 4B and 5, the blue organic photoelectric conversion device 2200, the red organic photoelectric conversion device 2300, and the green organic photoelectric conversion device 2100 may respectively constitute a first pixel 20a, a second pixel 20b, and a third pixel 20c.

The image sensor 20 may have excellent absorption balance between blue, red, and green colors. As mentioned above, the organic photoelectric conversion layer may include a p-type semiconductor material and an n-type semiconductor material. The higher the content of the n-type semiconductor material (e.g., $C_{60}$) in the organic photoelectric conversion layer, the higher the absorption rate of light in the blue wavelength spectrum of the organic photoelectric conversion layer. Since the image sensor 20 includes a blue organic photoelectric conversion device 2200 configured to selectively absorb light in a blue wavelength spectrum near the light incident surface, the blue organic photoelectric conversion device 2200 may be configured to preferentially absorb light in the blue wavelength spectrum and prevent light in the blue wavelength spectrum from being absorbed and lost in advance by the green organic photoelectric conversion device 2100. In addition, the green organic photoelectric conversion device 2100 may further increase wavelength selectivity for the green wavelength spectrum by reducing absorption of light in the blue wavelength spectrum of the n-type semiconductor material. In other words, the blue organic photoelectric conversion device 2200 may be configured to sufficiently absorb light in the blue wavelength spectrum, thereby enhancing external quantum efficiency in the blue wavelength spectrum, and the green organic photoelectric conversion device 2100 may reduce an absorption amount of light in a blue wavelength spectrum, thereby increasing sensitivity to the green wavelength spectrum. Specifically, the image sensor 20 may have a high absorption balance in a green wavelength spectrum, a blue wavelength spectrum, and a red wavelength spectrum. For example, a ratio of the maximum peak external quantum efficiency in the blue wavelength spectrum to the maximum peak external quantum efficiency in the green wavelength spectrum and/or a ratio of the maximum peak external quantum efficiency in the red wavelength spectrum to the maximum peak external quantum efficiency in the green wavelength spectrum may respectively be greater than or equal to about 0.5, greater than or equal to about 0.55, greater than or equal to about 0.6, greater than or equal to about 0.65, greater than or equal to about 0.7, greater than or equal to about 0.75, greater than or equal to about 0.8 and less than or equal to about 1.2, less than or equal to about 1.1, less than or equal to about 1.0, or less than or equal to about 0.95. The external quantum efficiency may be the external quantum efficiency when a particular (or, alternatively, predetermined) voltage (e.g., about 3.0 V or about 10.0 V) is applied to each of the organic photoelectric conversion devices 2100, 2200, and 2300.

As shown, the green organic photoelectric conversion device 2100 may include an upper electrode 2110, a green organic photoelectric conversion layer 2120, and a lower electrode 2130. As shown, the blue organic photoelectric conversion device 2200 may include an upper electrode 2210, a blue organic photoelectric conversion layer 2220, and a lower electrode 2230. As shown, the red organic photoelectric conversion device 2300 may include an upper electrode 2310, a red organic photoelectric conversion layer 2320, and a lower electrode 2330. As shown, the blue and red organic photoelectric conversion devices 2200 and 2300 may be separate portions of a single organic photoelectric conversion device 2201 that includes a common upper electrode 2205 having separate portions that define the separate upper electrodes 2210 and 2310, a single organic photoelectric conversion layer 2225 having separate portions that define the separate blue and red organic photoelectric conversion layers 2220 and 2320, and separate lower electrodes 2230 and 2330.

The single organic photoelectric conversion layer 2225 may be configured to selectively absorb light in two wavelength spectrums (e.g., blue and red wavelength spectrums), and at least one of the separate portions of the single organic photoelectric conversion layer 2225 that define the blue and red organic photoelectric conversion layers 2220 and/or 2230 may overlap with an optical filter (e.g., optical filter 992-1 or 992-2) that is configured to selectively absorb one of the two wavelength spectrums and selectively transmit at least the other one of the two wavelength spectrums (e.g., optical filter 992-2 may selectively absorb light in the blue wavelength spectrum and selectively transmit light in the red wavelength spectrum).

The portion of the single organic photoelectric conversion layer 2225 that defines the red organic photoelectric conversion layer 2320 (which may be configured to selectively absorb light in the blue and red wavelength spectrums) may receive light in the red wavelength spectrum that is selectively transmitted by the overlapping optical filter (e.g., 992-2) and may not receive light in the blue wavelength spectrum due to the optical filter (e.g., 992-2) selectively absorbing said light in the blue wavelength spectrum and thus preventing said light in the blue wavelength spectrum from reaching the red organic photoelectric conversion layer 2320. The portion of the single organic photoelectric conversion layer 2201 that defines the blue organic photoelectric conversion layer 2220 (which may be configured to selectively absorb light in the blue and red wavelength spectrums) may receive light in the blue wavelength spectrum that is selectively transmitted by the overlapping optical filter (e.g., 992-1) and may not receive light in the red wavelength spectrum due to the optical filter (e.g., 992-1) selectively absorbing said light in the red wavelength spectrum and thus preventing said light in the red wavelength spectrum from reaching the blue organic photoelectric conversion layer 2220.

As a result, The blue and red organic photoelectric conversion devices 2200 and 2300 may be configured to selectively absorb light in different wavelength spectrums, even though the respective organic photoelectric conversion layers 2220 and 2320 thereof may be separate portions of a single organic photoelectric conversion layer 2225 configured to selectively absorb the same wavelength spectrums of light, due to the separate organic photoelectric conversion devices 2200 and 2300 including different optical filters 992-1 and 992-2 (or one of the organic photoelectric conversion devices 2200 and 2300 including an optical filter and the other not including any optical filter) overlapping the respective portions of the single organic photoelectric conversion layer 2225 that define the respective organic photoelectric conversion layers 2220 and 2320 of the separate organic photoelectric conversion devices 2200 and 2300.

The blue organic photoelectric conversion device 2200, the green organic photoelectric conversion device 2100, and the red organic photoelectric conversion device 2300 may include organic photoelectric conversion layers 2220, 2120, and 2320 configured to selectively absorb light in the blue, green, and red wavelength spectra and convert them into electrical signals, between the upper electrode and the lower electrode.

The organic photoelectric conversion layers 2220, 2120, and 2320 may include a p-type semiconductor material and an n-type semiconductor material. The structure of the organic photoelectric conversion layer (p-type layer/n-type layer, etc.), energy levels of the p-type semiconductor material and the n-type semiconductor material, etc. may be referred to the aforementioned descriptions.

The organic photoelectric conversion layers 2220, 2120, and 2320, and thus the organic photoelectric conversion devices 2200, 2100, and 2300, may each independently have a volume ratio of an n-type semiconductor material to a p-type semiconductor material (thickness ratio when implemented as a plurality of layers) of greater than or equal to about 0.2 and less than or equal to about 2.0. For example, the volume ratio of the n-type semiconductor material to the p-type semiconductor material may be greater than or equal to about 0.3, greater than or equal to about 0.5, greater than or equal to about 0.7, greater than or equal to about 0.9, greater than or equal to about 1.0, greater than or equal to about 1.2 and less than or equal to about 2.0, less than or equal to about 1.8, or less than or equal to about 1.6.

The p-type semiconductor material of the organic photoelectric conversion layers 2220, 2120, and 2320 may include a compound having a maximum absorption wavelength ($\lambda_{a,max}$) in a blue wavelength spectrum, a green wavelength spectrum, and a red wavelength spectrum, respectively. The p-type semiconductor material of the organic photoelectric conversion layers 2220, 2120, and 2320 may have a higher absorption spectrum of a desired absorption wavelength spectrum than that of other wavelength spectrums. For example, the absorption spectrum of the desired absorption wavelength spectrum may be greater than or equal to about 70%, greater than or equal to about 75%, greater than or equal to about 80%, greater than or equal to about 85%, greater than or equal to about 90%, or greater than or equal to about 95% of the total area of the absorption spectrum.

The p-type semiconductor materials of the organic photoelectric conversion layers 2220, 2120, and 2320 may each independently include the aforementioned compound represented by Chemical Formula A.

The p-type semiconductor material of the blue organic photoelectric conversion layer 2220, and thus of the blue organic photoelectric conversion device 2200, may include a material known in the art as an organic compound configured to selectively absorb light in a blue wavelength spectrum and convert it into an electrical signal. For example, the p-type semiconductor material may include thiophene, thiophene derivatives, rubrene, a rubrene derivative, tetracene, a tetracene derivative, coumarin, a coumarin derivative, and the like, or a combination thereof. Specifically, the p-type semiconductor material of the blue organic photoelectric conversion device 2200 may be biphenyl-trithiophene.

The p-type semiconductor material of the green organic photoelectric conversion layer 2120, and thus of the green organic photoelectric conversion device 2100, may include a material known in the art as an organic compound configured to selectively absorb light in a green wavelength spectrum and convert it into an electrical signal. For example, the p-type semiconductor material of the green organic photoelectric conversion device 2100 may include one or more of the aforementioned compounds represented by any one of Chemical Formulas A-1 to A-9.

The p-type semiconductor material of the red organic photoelectric conversion layer 2320, and thus of the red organic photoelectric conversion device 2300, may include a material known in the art as an organic compound configured to selectively absorb light in a red wavelength spectrum and convert it into an electrical signal. For example, the p-type semiconductor material of the red organic photoelectric conversion device 2300 may include a metal-phthalocyanine derivative such as copper phthalocyanine or a derivative thereof.

The n-type semiconductor material of the organic photoelectric conversion layers 2220, 2120, and 2320 may refer to the n-type semiconductor materials of the first and second organic photoelectric conversion layers 120 and 220, and any one of the organic photoelectric conversion layers 2220, 2120, or 2320 or a plurality thereof (e.g., all three layers) may include fullerene ($C_{60}$) as the n-type semiconductor material.

The n-type semiconductor materials of the blue organic photoelectric conversion device 2200, the green organic photoelectric conversion device 2100, and the red organic photoelectric conversion device 2300 may each independently include an organic metal complex, a derivative of an organic metal complex, carboxylic anhydride, a derivative of carboxylic anhydride, perylene diimide, a derivative of perylene diimide, thiophene, a thiophene derivative, fullerene, a fullerene derivative, or a combination thereof. An n-type semiconductor material of at least one of the blue organic photoelectric conversion device 2200, the green organic photoelectric conversion device 2100, or the red organic photoelectric conversion device 2300 may include fullerene or a fullerene derivative.

The organic photoelectric conversion devices 2200, 2100, and 2300 may be disposed on the substrate 500, and the lower electrodes 2230 and 2330 of the blue and red organic photoelectric conversion devices 2200 and 2300 and the substrate 500 may be electrically connected each other respectively through the first and second charge transfer paths 621 and 622. The substrate 500 may not include any separate photo-detecting devices, such as any silicon-based photodiodes. Since the image sensor 20 includes no optical filter between two stacked organic photoelectric conversion devices, the first and second charge transfer paths 621 and 622 may have a small length and/or a small aspect ratio. The first and second charge transfer paths 621 and 622 may independently have a length in the vertical direction Z of greater than or equal to about 50 nm and less than or equal to about 500 nm. For example, the first and second charge transfer paths 621 and 622 may independently have a length of greater than or equal to about 70 nm, greater than or equal to about 100 nm, greater than or equal to about 120 nm, or greater than or equal to about 150 nm and less than or equal to about 450 nm, less than or equal to about 400 nm, less than or equal to about 350 nm, or less than or equal to about 300 nm. The first and second charge transfer paths 621 and 622 may independently have a maximum aspect ratio of greater than or equal to about 0.5 and less than or equal to about 10.0. For example, the first and second charge transfer paths 621 and 622 may independently have a maximum aspect ratio of greater than or equal to about 1.0, greater than or equal to about 1.5, or greater than or equal to about 2.0 and less than or equal to about 9.0, less than or equal to about 8.0, less than or equal to about 7.0, less than or equal to about 6.0, or less than or equal to about 5.0. The first and second charge transfer paths 621 and 622 may independently have an average aspect ratio of greater than or equal to about 2.0 and less than or equal to about 7.0. For example, the first and second charge transfer paths 621 and 622 may independently have an average aspect ratio of greater than or equal to about 2.5 or greater than or equal to about 3.0 and less than or equal to about 6.5 or less than or equal to about 6.0.

Between the light incident surface 301a of the image sensor 20 and the red organic photoelectric conversion device 2300, an optical filter 992-2 configured to selectively absorb light in the blue wavelength spectrum (e.g., selectively transmit at least light in the red wavelength spectrum and light in the green wavelength spectrum) may be further disposed on the red organic photoelectric conversion device 2300 (e.g., directly on the upper electrode 2310). Since this optical filter may be configured to first absorb light in the blue wavelength spectrum at the light incident surface, selective wavelength absorptions of the red and green organic photoelectric conversion devices 2100 and 2300 may be improved. This optical filter may include the same light absorbing material as material in the blue organic photoelectric conversion layer 2220 and be formed at the same time as the formation of the blue organic photoelectric conversion layer 2220. Similarly, another optical filter (not shown) configured to selectively absorb light in the red wavelength spectrum may be further between the light incident surface of the image sensor 20 and the blue organic photoelectric conversion device 2200.

Referring to FIGS. 2-3, it will be understood that, in some example embodiments, the second organic photoelectric conversion device 200 may be configured to selectively absorb light in a second wavelength spectrum that is different from the first wavelength spectrum, where the second wavelength spectrum may be the same or different from the entire visible wavelength spectrum. It will be understood that a wavelength spectrum that is different from another wavelength spectrum may at least partially or completely overlap with some or all of the other wavelength spectrum and may be within the other wavelength spectrum.

Referring to FIGS. 4A and 4B and 5, the green organic photoelectric conversion device 2100 may sometimes be referred to as a first organic photoelectric conversion device, and the blue and red organic photoelectric conversion devices 2200 and 2300 may be considered to be separate portions of a single organic photoelectric conversion device 2201 (e.g., second organic photoelectric conversion device), where said separate portions may be differently configured to selectively absorb or non-selectively absorb light in different wavelength spectrums based on overlapping or not overlapping with one or more optical filters (e.g., 992-1 and/or 992-2) in the vertical direction Z.

In view of at least the above, as shown in at least FIGS. 3 and 4A-4B, the image sensor (10 and/or 20) may include at least a first organic photoelectric conversion device (e.g., 100 or 2100), the first organic photoelectric conversion device being configured to selectively absorb light in a first wavelength spectrum within a visible wavelength spectrum (e.g., light in a green wavelength spectrum) and convert the selectively absorbed light in the first wavelength spectrum into a first electrical signal. The image sensor (10 and/or 20) may further include a second organic photoelectric conversion device (e.g., 200 or 2201) at least partially overlapping the first organic photoelectric conversion device (e.g., 100 or 2210) in the vertical direction Z that is perpendicular to the upper surface (e.g., 101a and/or 2101a) of the first organic photoelectric conversion device, where the second organic photoelectric conversion device is configured to selectively absorb light in a second wavelength spectrum within the visible wavelength spectrum (e.g., blue and/or red light in FIGS. 4A and 4B, the entire visible wavelength spectrum in FIG. 3, etc.) and convert the selectively absorbed light in the second wavelength spectrum into a second electrical signal, the second wavelength spectrum being different from the first wavelength spectrum. As shown in FIGS. 3-4B, the image sensor 10 may have has a first partition (i) and a second partition (ii) offset from each other along an in-plane direction (e.g., the first horizontal direction X) that is perpendicular to the vertical direction Z and parallel to the upper surface 101a of the first organic photoelectric conversion device 100. As shown in FIGS. 3-4B, the first partition (i) may include a first portion of the first organic photoelectric conversion device (e.g., 100-1 or 2100-1) and a first portion of the second organic photoelectric conversion device (e.g., 200-1 or 2200), and the second partition includes a second portion of the first organic photoelectric conversion device (e.g., 100-2 or 2100-2) and a second portion of the second organic photoelectric conversion device (e.g., 200-2 or 2300). As shown in FIGS. 3-4B, at least one of the first partition or the second partition may include a first optical filter (e.g., 300, 400, 992-1, and/or 992-2) configured to selectively transmit at least light in a third wavelength spectrum (e.g., at least blue light for first optical filter 300, at least red light for second optical filter 400, at least red light in addition to green light for optical filter 992-2, at least blue light in addition to green light for optical filter 992-1) within the visible wavelength spectrum and selectively absorb light in at least a portion of at least one of the first wavelength spectrum or the second wavelength spectrum (e.g., at least red light for optical filter 300, at least blue light for second optical filter 400, at least blue light for optical filter 992-2, at least red light for optical filter 992-1), the third wavelength spectrum being different from the first wavelength spectrum and the second wavelength spectrum. Said first optical filter (e.g., 300, 400, 992-1, 992-2) may be between a light incidence surface 301a of the image sensor and the first organic photoelectric conversion device in the vertical direction Z (e.g., as shown in FIGS. 4A and 4B), or between the first organic photoelectric conversion device and the second organic photoelectric conversion device in the vertical direction Z. (e.g., as shown in FIG. 3).

As shown in at least FIG. 3, the second wavelength spectrum that the second organic photoelectric conversion device is configured to selectively absorb may be the visible wavelength spectrum (also referred to herein as the entire visible wavelength spectrum), and the first wavelength spectrum (that the first organic photoelectric conversion device is configured to selectively absorb) and the third wavelength spectrum (at least selectively transmitted by the first optical filter) are both within the visible wavelength spectrum, and the first organic photoelectric conversion device (e.g., 100) may be configured to selectively absorb light in the first wavelength spectrum within the visible wavelength spectrum, and the second organic photoelectric conversion device (e.g., 200) may be under the first organic photoelectric conversion device and may be configured to non-selectively absorb light in the visible wavelength spectrum. Still referring to FIG. 3, the first partition (i) may include the first optical filter (e.g., 300) between the first portions of the first organic photoelectric conversion device and the second organic photoelectric conversion device (e.g., 100-1 and 200-1) in the vertical direction, the first optical filter being configured to selectively transmit light in the third wavelength spectrum (e.g., blue wavelength spectrum). Still referring to FIG. 3, the second partition (ii) may include a second optical filter (e.g., 400) between the second portions of the first organic photoelectric conversion device and the second organic photoelectric conversion device (e.g., 100-2 and 200-2) in the vertical direction Z, the second optical filter (e.g., 400) being configured to selectively transmit light in a fourth wavelength spectrum (e.g., red wavelength spectrum) within the visible wavelength spectrum, the fourth wavelength spectrum being different from each of the first, second, and third wavelength spectrums (e.g., green wavelength spectrum, entire visible wavelength spectrum, and blue wavelength spectrum, respectively).

As shown in at least FIG. 3, the first wavelength spectrum (which the first organic photoelectric conversion device 100 may be configured to selectively absorb) is a green wavelength spectrum within the visible wavelength spectrum, the second wavelength spectrum (which the second organic photoelectric conversion device 200 may be configured to selectively absorb) may be the visible wavelength spectrum, the third wavelength spectrum (which the first optical filter 300 may be configured to at least selectively transmit) may be a blue wavelength spectrum within the visible wavelength spectrum, and the fourth wavelength spectrum (which the second optical filter 400 may be configured to at least selectively transmit) may be a red wavelength spectrum within the visible wavelength spectrum. However, it will be understood that example embodiments are not limited thereto, and the first through fourth wavelength spectrums as described above may be different wavelength spectrums (e.g., the first wavelength spectrum may be a blue wavelength spectrum, the third wavelength spectrum may be a green wavelength spectrum, and the fourth wavelength spectrum may be a red wavelength spectrum). In some example embodiments, the second wavelength spectrum may be smaller than the entire visible wavelength spectrum and may at least partially not overlap with the first wavelength spectrum. For example, in some example embodiments the second wavelength spectrum may be the blue wavelength spectrum while the first wavelength spectrum is the green wavelength spectrum.

As shown in at least FIGS. 4A and 4B, the first organic photoelectric conversion device may be under the second organic photoelectric conversion device (e.g., the first organic photoelectric conversion device may be the green organic photoelectric conversion device 2100 and the second organic photoelectric conversion device may be the single organic photoelectric conversion device 2201 that includes the blue and red organic photoelectric conversion devices 2200 and 2300), and the first optical filter may be between the light incidence surface 301a of the image sensor and the second organic photoelectric conversion device (e.g., 2201) in the vertical direction. Z (e.g., the first optical filter may be one or more of optical filters 992-1 and/or 992-2).

In some example embodiments, and as shown in at least FIG. 4A, the blue and red photoelectric conversion devices 2200 and 2300 may be considered to be separate portions of a single organic photoelectric conversion device 2201 based on sharing separate portions of one or more layers (e.g., separate portions of a common upper electrode 2205 being defined as the separate, respective upper electrodes 2210 and 2310 of the blue and red organic photoelectric conversion devices 2200 and 2300, separate portions of a single organic photoelectric conversion layer 2225 being defined as the separate, respective organic photoelectric conversion layers 2220 and 2320 of the blue and red organic photoelectric conversion devices 2200 and 2300, etc.). As shown in FIGS. 4A and 4B, at least some of the separate blue and red organic photoelectric conversion devices 2200 and 2300 may be in direct contact or isolated from direct contact with each other (e.g., organic photoelectric conversion layers 2220 and 2320 may be in direct contact at interface 401a or isolated from direct contact in the first horizontal direction X with insulating layer 990 therebetween and may include separate photoelectric conversion layers having same or different total material compositions).

As shown in at least FIGS. 4A and 4B, the first optical filter (which may be one of optical filter 992-1 or 992-2) may be included in one of the first partition (i) or the second partition (ii) and is not included in another one of the first partition (i) or the second partition (ii), such that the first optical filter overlaps the second portions of the first and second organic photoelectric conversion devices in the vertical direction and does not overlap the first portions of the first and second organic photoelectric conversion devices in the vertical direction (e.g., the first optical filter may be optical filter 992-2 that overlaps the second portion 2100-2 of the green organic photoelectric conversion device 2100 and overlaps the red organic photoelectric conversion device 2300 that is a second portion of the single organic photoelectric conversion device 2201 and does not overlap the first portion 2100-1 of the green organic photoelectric conversion device 2100 and does not overlap the blue organic photoelectric conversion device 2200 that is a first portion of the single organic photoelectric conversion device 2201), or the first optical filter overlaps the first portions of the first and second organic photoelectric conversion devices in the vertical direction and does not overlap the second portions of the first and second organic photoelectric conversion devices in the vertical direction (e.g., the first optical filter may be optical filter 992-1 that overlaps the first portion 2100-1 of the green organic photoelectric conversion device 2100 and overlaps the blue organic photoelectric conversion device 2200 that is a first portion of the single organic photoelectric conversion device 2201 and does not overlap the second portion 2100-2 of the green organic photoelectric conversion device 2100 and does not overlap the red organic photoelectric conversion device 2300 that is a second portion of the single organic photoelectric conversion device 2201). The first optical filter (e.g., optical filter 992-1 or 992-2) may be configured to selectively transmit light in both the first and third wavelength spectrums. For example, in FIGS. 4A and 4B, the first wavelength spectrum may be the green wavelength spectrum, and the third wavelength spectrum may be the blue wavelength spectrum when the first optical filter is optical filter 992-1 or may be the red wavelength spectrum when the first optical filter is optical filter 992-2.

As shown in at least FIGS. 4A and 4B, the first wavelength spectrum that the first organic photoelectric conversion device (e.g., 2100) is configured to selectively absorb may be a green wavelength spectrum within the visible wavelength spectrum, the second wavelength spectrum which the second organic photoelectric conversion device (e.g., 2201) is configured to selectively absorb may include both a blue wavelength spectrum within the visible wavelength spectrum and a red wavelength spectrum within the visible wavelength spectrum and may not include the green wavelength spectrum, and the third wavelength spectrum which the first optical filter is configured to at least selectively transmit (e.g., in addition to the first wavelength spectrum) may be the blue wavelength spectrum (e.g., when the first optical filter is optical filter 992-1) or the red wavelength spectrum (e.g., when the first optical filter is optical filter 992-2). However, example embodiments are not limited thereto, and the first to third wavelength spectrums may be different wavelength spectrums.

As shown in at least FIGS. 4A and 4B, the first optical filter may overlap the first portions of the first and second organic photoelectric conversion devices in the vertical direction Z and may not overlap the second portions of the first and second organic photoelectric conversion devices in the vertical direction Z (e.g., the first optical filter may be optical filter 992-1), and the second partition (ii) may include a second optical filter that overlaps the second portions of the first and second organic photoelectric conversion devices in the vertical direction and does not overlap the first portions of the first and second organic photoelectric conversion devices in the vertical direction (e.g., the second optical filter may be optical filter 992-2). The second optical filter (e.g., 992-2) may be configured to selectively transmit light in both the first wavelength spectrum and a fourth wavelength spectrum, the fourth wavelength spectrum being within the visible wavelength spectrum, the fourth wavelength spectrum being different from each of the first to third wavelength spectrums. For example, where the first wavelength spectrum is the green wavelength spectrum, the second wavelength spectrum includes both the blue and red wavelength spectrums and does not include the green wavelength spectrum, and the third wavelength spectrum is the blue wavelength spectrum, the fourth wavelength spectrum may be the red wavelength spectrum, but example embodiments are not limited thereto.

It will be understood that one or both of the optical filters 300 and/or 400 may be omitted from the image sensor 10. Additionally, with regard to FIGS. 4A and 4B, one or both of the optical filters 992-1 and/or 992-2 may be included or omitted from the image sensor 20. In some example embodiments, an optical filter 300, 400, 992-1, and/or 992-2 may extend through both the first and second partitions (i) and (ii), and a given partition may include multiple optical filters. For example, in FIGS. 2-3, the second optical filter 400 may be absent and the optical filter 300 may overlap both the first and second portions of both the first organic photoelectric conversion device 100 and the second organic photoelectric conversion device 200 (e.g., portions 100-1 and 100-2 and 200-1 and 200-2) in the vertical direction Z. In another example, in FIGS. 4A and 4B, optical filter 992-1 may be absent while optical filter 992-2 may be present in the second partition (ii). In another example, in FIGS. 4A and 4B, the optical filter 992-1 may be present in the first partition (i) and not the second partition (ii) while the optical filter 992-2 may extend through both the first and second partitions (i) and (ii) such that the first partition (ii) includes both optical filters 992-1 and 992-2 overlapping each other in the vertical direction Z.

In another example, in FIGS. 2-3, the second optical filter 400 may be absent and the optical filter 300 may be between the first organic photoelectric conversion device 100 and the light incidence surface 301a and may overlap both the first and second portions of both the first organic photoelectric conversion device 100 and the second organic photoelectric conversion device 200 (e.g., portions 100-1 and 100-2 and 200-1 and 200-2) in the vertical direction Z.

In another example, in FIGS. 4A and 4B, one of optical filters 992-1 or 992-2 may overlap both the first and second portions 2100-1 and 2100-2 of the green organic photoelectric conversion device 2100 and the first and second portions of the second organic photoelectric conversion device that define the blue and red organic photoelectric conversion devices 2200 and 2300 in the vertical direction Z.

The image sensors 10 and 20 may be manufactured in a general method known in the related field. Specifically, the image sensors 10 and 20 may be manufactured by forming the lower organic photoelectric conversion devices 200 and 2100 respectively on the substrate 500, forming the lower insulating layer 710, forming a charge transfer path, forming the upper organic photoelectric conversion devices 100, 2200, and 2300, forming the upper insulating layer 730, and forming the transparent layer 900 and the focusing lens 800. The image sensor 10 may be manufactured by further forming the first and second optical filters 300 and 400 after forming the lower insulating layer 710 and then, further forming the interlayer insulating layer 720. The organic photoelectric conversion devices 200, 2100, 2200, and 2300 may be manufactured by forming an organic photoelectric conversion layer after patterning a conductive layer to form a lower electrode (a pixel electrode) and then, forming a conductive layer as an upper electrode (a common electrode) thereon. The patterning of the electrode, the organic photoelectric conversion layer, the charge transfer path, the insulating layer, the transparent layer, the focusing lens, and the like may be performing by adopting a well-known method in the related art, which may include, for example, a deposition method of using a shadow mask, a hard mask and photolithography process of using SiN and the like.

The image sensors 10 and 20 and/or the image processing apparatus 1 may applied to (e.g., included in) various electronic devices. Specifically, the electronic devices may include mobile phones, cameras, biometric devices, or automotive electronic parts. The electronic devices may include, for example, built-in fingerprint recognition sensors (fingerprint on display).

Figure 6:
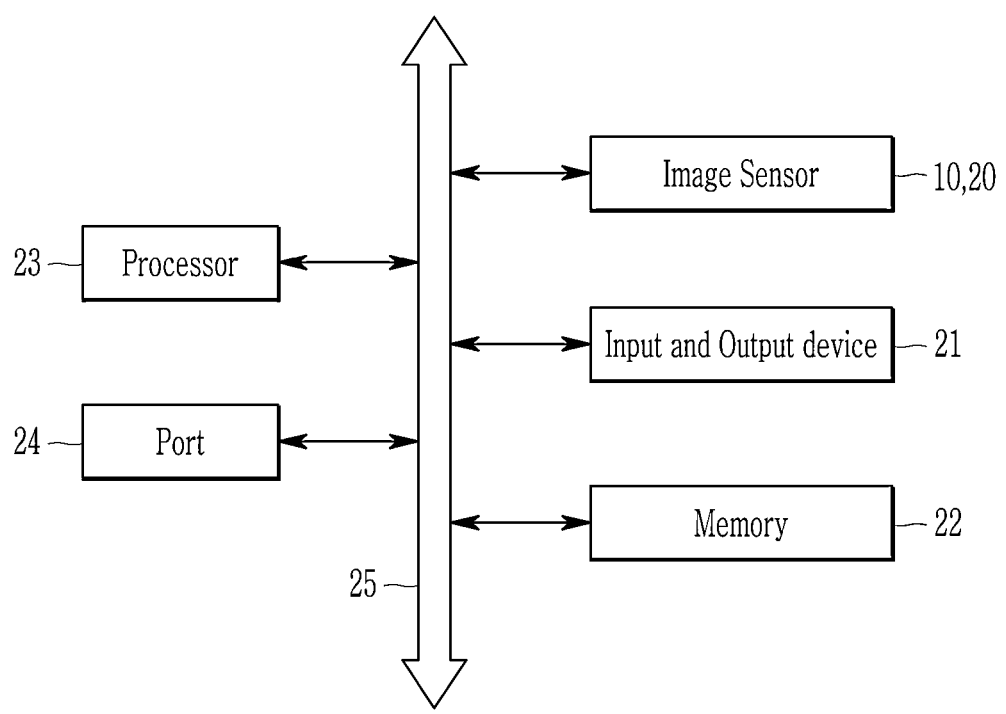
FIG. 6 is a schematic view of an electronic device according to some example embodiments.

FIG. 6 is a schematic view of an electronic device according to some example embodiments.

Referring to FIG. 6, an electronic device 2 may include one or more image sensors according to any of the example embodiments (e.g., one or more image sensors 10 and/or one or more image sensors 20), an input and output device 21, a memory 22, a processor 23, and a port 24. Although not shown, the electronic device 2 may further include a wired and/or wireless communication interface device, a power device, and the like. In some example embodiments, the input and output device 21 may be and/or include a wired and/or wireless communication interface device (e.g., a Bluetooth® communication transceiver). The port 24 may be a device provided for the electronic device 2 for communicating with a video card, a sound card, a memory card, a USB device, and the like.

The processor 23 may perform a specific operation, instruction, task, and/or the like. The processor 23 may be a central processing unit CPU or a microprocessor unit MCU and may communicate through a bus 25 with other devices connected to the memory 22, the input and output device 21, the image sensors 10 and 20, and/or the port 24.

The memory 22 may be a storage medium that stores data that may be executed by the processor 23 to operate the electronic device 2, multimedia data, or the like. The memory 22 may include a non-volatile memory or a volatile memory such as a random access memory RAM, or a flash memory, or the like. In addition, the memory 22 may include a solid state drive SSD, a hard disk drive HDD, and/or an optical disk drive ODD as a storage device.

The input and output device 21 (also referred to herein as an interface device) may include an input device such as a keyboard, a mouse, a touchscreen, and the like provided to a user and an output device such as a display and an audio output unit (e.g., one or more audio speakers). The display may include a light emitting diode (LED) screen, an organic LED (OLED) screen, or the like. The image sensors 10 and 20 may be connected to the processor 23 through the bus 25 or other communication means. The processor 23 may execute the functions of the image processor 40 of FIG. 1 above.

The memory 22 may be a non-transitory computer readable medium and may store a program of instructions. The memory 22 may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM). The processor 23 may execute the stored program of instructions to perform one or more functions. For example, the processor 23 may be configured to process electrical signals generated by the image sensor(s) (e.g., image sensor(s) 10 and/or 20). The processor 23 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processor 23 may be configured to generate an output (e.g., an electrical signal) and/or process an output from the image sensor(s) (e.g., image sensor(s) 10 and/or 20) based on such processing. The processor 23 may transmit a signal to the input and output device and/or port 24 based on the generated output, for example to cause the input and output device 21 to display an image and/or to transmit data associated with an image to an external device via port 24 and/or via the input and output device 21.

Hereinafter, the technical content of the organic photoelectric conversion device will be described in more detail through some example embodiments. However, the present scope of the inventive concepts is not limited to these examples.

Manufacture of Organic Photoelectric Conversion Device I

Example 1

On a glass substrate, ITO is sputtered to form a 150 nm-thick lower electrode (an anode), a compound represented by Chemical Formula 1 (FujiFilm Electronic Imaging Co., Ltd.) is thermally deposited on the lower electrode to form a 5 nm to 30 nm-thick lower buffer layer, and a compound represented by Chemical Formula 2 (a p-type semiconductor material) and fullerene ($C_{60}$, an n-type semiconductor) are co-deposited in a volume ratio (a thickness ratio) of 1:0.67 to 1:1 to form a 100 nm-thick organic photoelectric conversion layer. On the organic photoelectric conversion layer, Yb is thermally deposited to form a 1.5 nm-thick upper buffer layer, and ITO is sputtered to form a 7 nm-thick upper electrode (a cathode). On the upper electrode (cathode), aluminum oxide ($Al_2O_3$) is deposited to be 40 nm thick and then, encapsulated with a glass plate to manufacture an organic photoelectric conversion device.

[Chemical Formula 1]

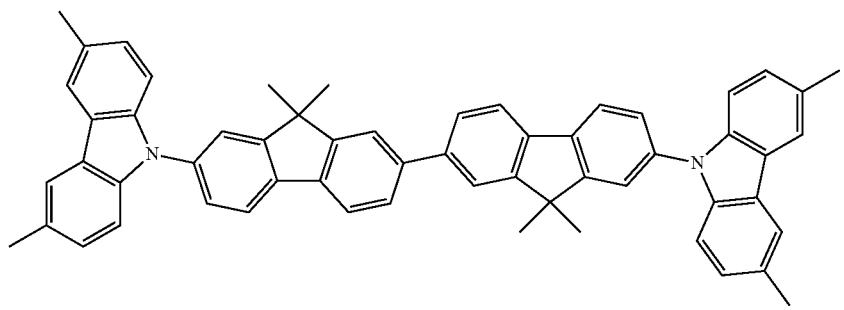

[Chemical Formula 2]

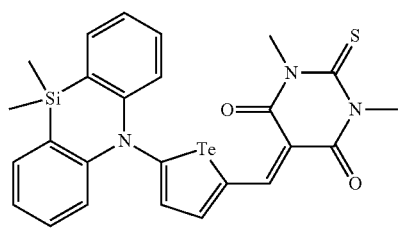

Example 2

An organic photoelectric conversion device is manufactured according to the same method as Example 1 except that a compound represented by Chemical Formula 3 is used instead of the compound represented by Chemical Formula 2 as the p-type semiconductor material.

[Chemical Formula 3]

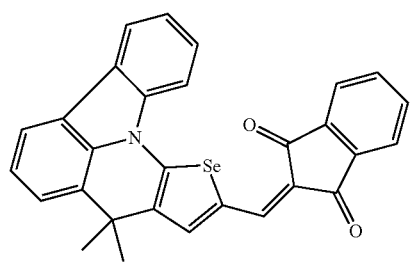

Example 3

An organic photoelectric conversion device is manufactured according to the same method as Example 1 except that a compound represented by Chemical Formula 4 is used instead of the compound represented by Chemical Formula 2 as the p-type semiconductor material.

[Chemical Formula 4]

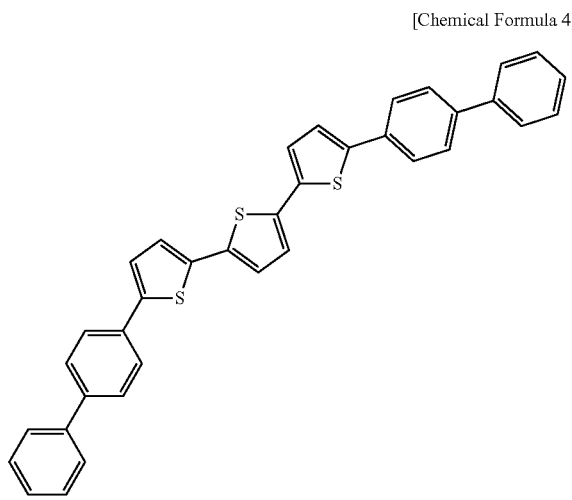 [SMILES: c1ccc(-c2ccc(-c3ccc(-c4ccc(-c5ccc(-c6ccc(-c7ccccc7)cc6)s5)s4)s3)cc2)cc1]

Example 4

An organic photoelectric conversion device is manufactured according to the same method as Example 1 except that a compound represented by Chemical Formula 5 is used instead of the compound represented by Chemical Formula 2 as the p-type semiconductor material.

[Chemical Formula 5]

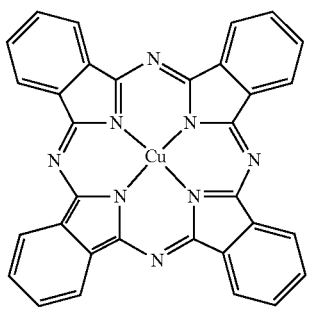

Evaluation of Photoelectric Characteristics I

Figure 7:
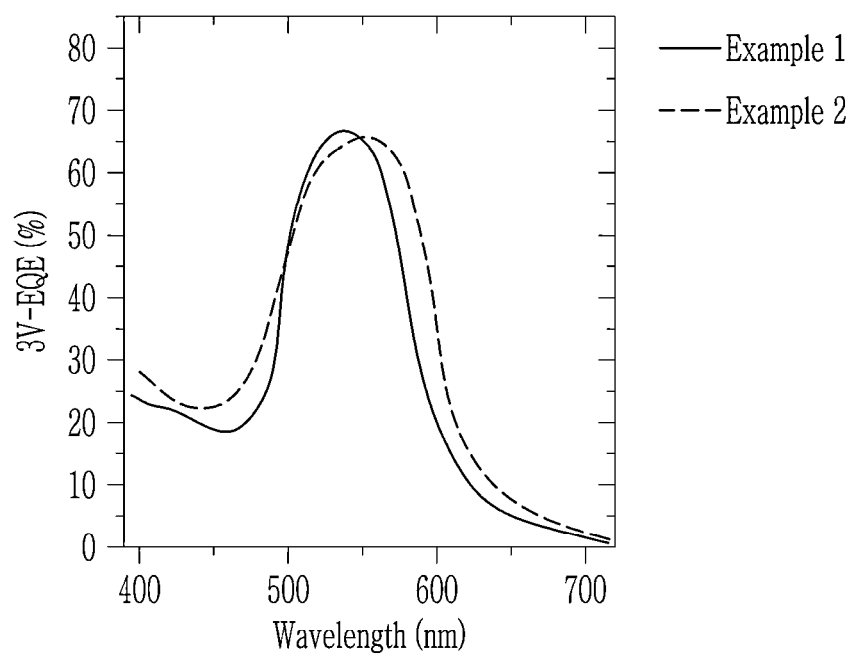
FIGS. 7, 8, 9, 10, and 11 are graphs showing photoelectric characteristics of organic photoelectric conversion devices according to Examples, according to some example embodiments.
Figure 8:
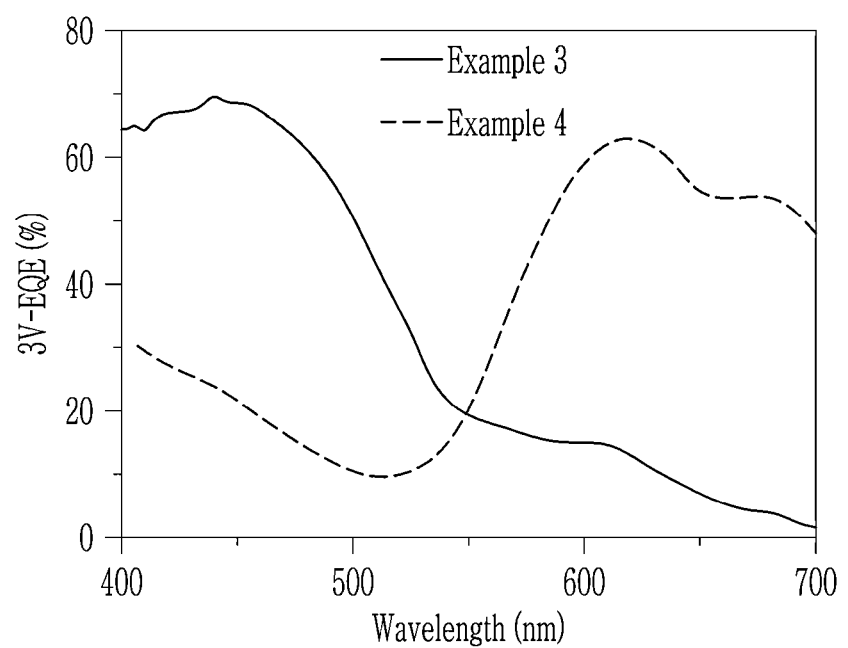

External quantum efficiency (EQE) depending on a wavelength of the organic photoelectric conversion devices according to Examples 1 to 4 is evaluated while applying a voltage of 3.0 V thereto, and the results are shown in FIGS. 7 and 8.

FIGS. 7 and 8 are graphs showing photoelectric characteristics of the organic photoelectric conversion devices according to Examples 1 to 4.

Referring to FIGS. 7 and 8, the organic photoelectric conversion devices according to Examples 1 and 2 may be configured to selectively absorb light in the green wavelength spectrum and convert it into an electrical signal, and the organic photoelectric conversion device according to Example 3 may be configured to selectively absorb light in the blue wavelength spectrum and convert it into an electrical signal, and the organic photoelectric conversion device according to Example 4 may be configured to selectively absorb light in the red wavelength spectrum and convert it into an electrical signal.

Evaluation of Photoelectric Characteristics II

Figure 9:
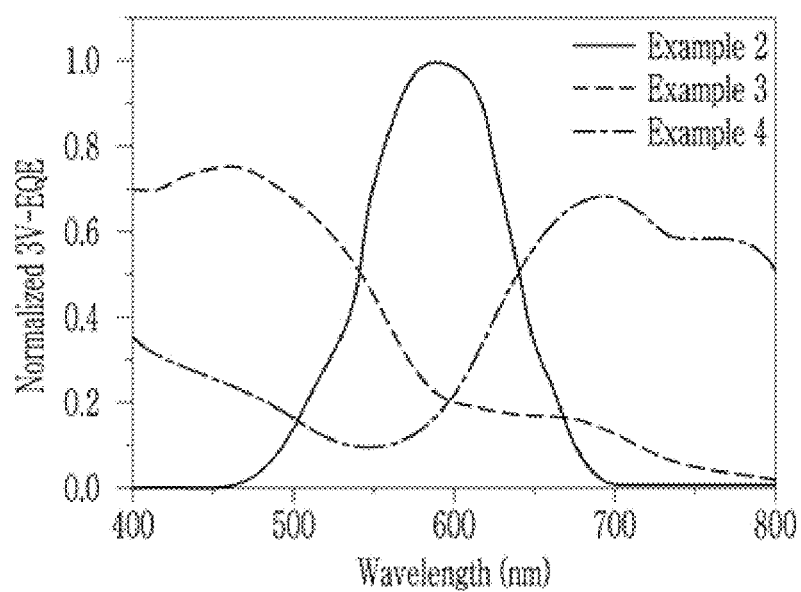

An image sensor having a structure shown in FIGS. 4A and/or 5 is manufactured using the organic photoelectric conversion devices according to Examples 2, 3, and 4, and then external quantum efficiency (EQE) thereof is calculated (simulated), and the results are shown in FIG. 9.

FIG. 9 is a graph showing photoelectric characteristics of the image sensor including the organic photoelectric conversion devices according to Examples 2 to 4.

Referring to FIG. 9, the image sensor exhibits that a maximum peak external quantum efficiency in the blue wavelength spectrum relative to a maximum peak external quantum efficiency in the green wavelength spectrum and a maximum peak external quantum efficiency of the red wavelength spectrum relative to the maximum peak external quantum efficiency in the green wavelength spectrum are all greater than or equal to 0.5, respectively.

Manufacture of Organic Photoelectric Conversion Device II

Example 5

An organic photoelectric conversion device is manufactured according to the same method as Example 1 except that a compound represented by Chemical Formula 6 instead of the compound represented by Chemical Formula 2 is used as the p-type semiconductor material, and the p-type semiconductor material and the n-type semiconductor are co-deposited in a volume ratio (a thickness ratio) of 1:3 to 1:5.

[Chemical Formula 6]

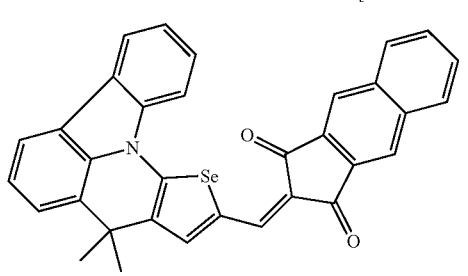

Example 6

An organic photoelectric conversion device is manufactured according to the same method as Example 5 except that a compound represented by Chemical Formula 7 instead of the compound represented by Chemical Formula 6 is used as the p-type semiconductor material.

[Chemical Formula 7]

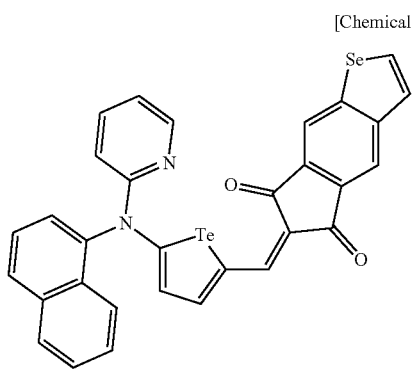

Evaluation of Photoelectric Characteristics III

Figure 10:
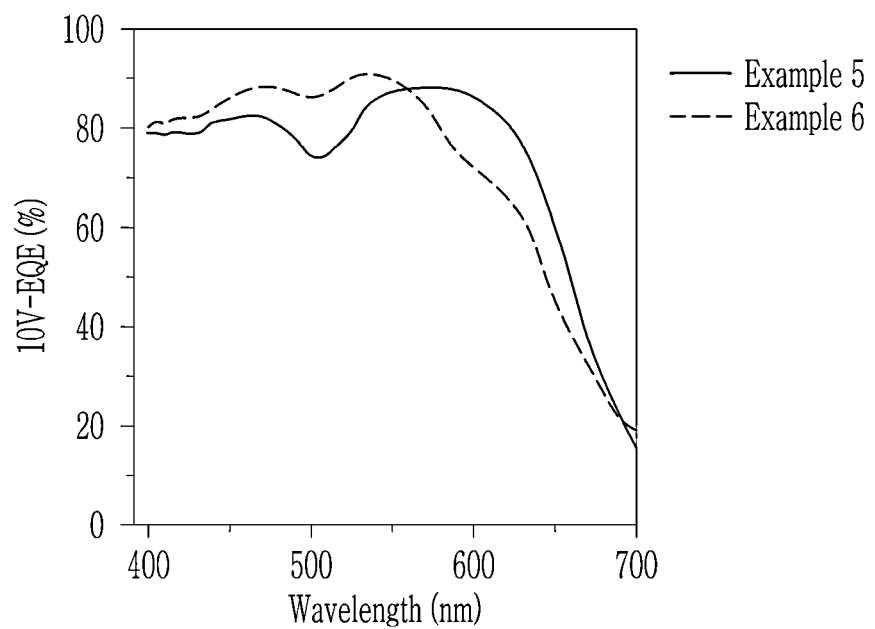

External quantum efficiency (EQE) depending on a wavelength of the organic photoelectric conversion devices according to Examples 5 and 6 is evaluated while applying a voltage of 10 V thereto, and the results are shown in FIG. 10.

FIG. 10 is a graph showing photoelectric characteristics of the organic photoelectric conversion devices according to Examples 5 and 6. Referring to FIG. 10, the organic photoelectric conversion devices according to Examples 5 and 6 may be configured to absorb light in the entire visible wavelength spectrum (e.g., a wavelength spectrum of greater than or equal to 400 nm and less than or equal to 650 nm) and convert it into an electric signal.

Manufacture of Organic Photoelectric Conversion Device III

Example 7

An organic photoelectric conversion device is manufactured according to the same method as Example 5 except that aluminum oxide $Al_2O_3$ is deposited to be 40 nm thick on the upper electrode (cathode), and then, an optical filter (FujiFilm Electronic Imaging Co., Ltd.) having a partition configured to selectively transmit light in the blue wavelength spectrum and a partition configured to selectively transmit light in the red wavelength spectrum is additionally introduced thereinto.

Example 8

An organic photoelectric conversion device is manufactured according to the same method as Example 7 except that a compound represented by Chemical Formula 6 instead of the compound represented by Chemical Formula 5 is used as the p-type semiconductor material.

Evaluation of Photoelectric Characteristics IV

Figure 11:
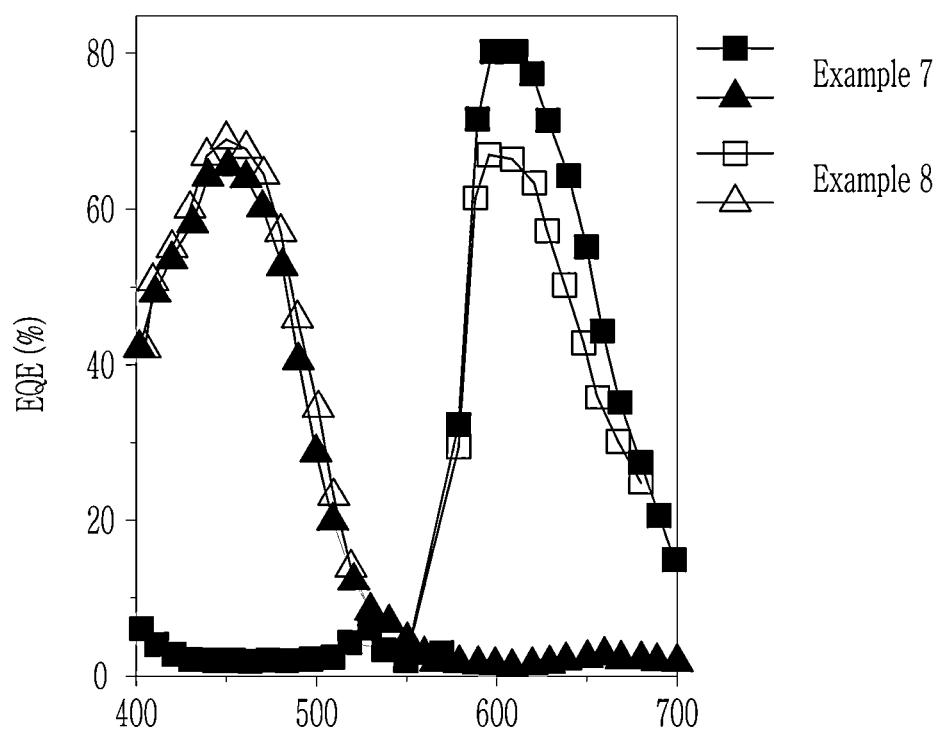

External quantum efficiency (EQE) depending on a wavelength of the organic photoelectric conversion devices according to Examples 7 and 8 is evaluated while applying a voltage of 10 V thereto, and the results are shown in FIG. 11. FIG. 11 is a graph showing photoelectric characteristics of the organic photoelectric conversion devices according to Examples 7 and 8. Referring to FIG. 11, the organic photoelectric conversion devices according to Examples 7 and 8 may be configured to selectively absorb light in the blue wavelength spectrum and the red wavelength spectrum and convert it into electrical signals.

While this disclosure has been described in connection with what is presently considered to be practical example embodiments, it is to be understood that the inventive concepts are not limited to said example embodiments. On the contrary, the inventive concepts are intended to cover various modifications and equivalent arrangements included within the spirit and scope of the appended claims.

What is claimed is:

1. An image sensor, comprising:
a substrate;
a first organic photoelectric conversion device on the substrate, the first organic photoelectric conversion device being configured to selectively absorb light in a first wavelength spectrum within a visible wavelength spectrum and convert the selectively absorbed light in the first wavelength spectrum into a first electrical signal; and
a second organic photoelectric conversion device on the substrate and under the first organic photoelectric conversion device such that the first organic photoelectric conversion device at least partially overlaps the second organic photoelectric conversion device in a vertical direction that is perpendicular to an upper surface of the substrate, the second organic photoelectric conversion device being configured to non-selectively absorb light in the visible wavelength spectrum and convert the non-selectively absorbed light in the visible wavelength spectrum into a second electrical signal,
wherein the image sensor has a first partition and a second partition offset from each other along an in-plane direction that is perpendicular to the vertical direction and parallel to the upper surface of the first organic photoelectric conversion device,
wherein the first partition includes at least a first portion of the first organic photoelectric conversion device, at least a first portion of the second organic photoelectric conversion device, and a first optical filter between the first portions of the first organic photoelectric conversion device and the second organic photoelectric conversion device in the vertical direction, the first optical filter being configured to selectively transmit light in a second wavelength spectrum within the visible wavelength spectrum, the second wavelength spectrum being different from the first wavelength spectrum,
wherein the second partition includes at least a second portion of the first organic photoelectric conversion device, at least a second portion of the second organic photoelectric conversion device, and a second optical filter between the second portions of the first organic photoelectric conversion device and the second organic photoelectric conversion device in the vertical direction, the second optical filter being configured to selectively transmit light in a third wavelength spectrum within the visible wavelength spectrum, the third wavelength spectrum being different from both the first wavelength spectrum and the second wavelength spectrum, wherein the first organic photoelectric conversion device includes a first upper electrode, a first lower electrode, and a first organic photoelectric conversion layer between the first upper electrode and the first lower electrode, the first organic photoelectric conversion layer configured to selectively absorb light in the first wavelength spectrum of the visible wavelength spectrum, wherein the second organic photoelectric conversion device includes a second upper electrode, a second lower electrode, and a second organic photoelectric conversion layer between the second upper electrode and the second lower electrode, the second organic photoelectric conversion layer configured to non-selectively absorb light in an entirety of the visible wavelength spectrum, and wherein a ratio of a maximum peak external quantum efficiency of the image sensor in a blue wavelength spectrum to a maximum peak external quantum efficiency of the image sensor in a green wavelength spectrum, a ratio of a maximum peak external quantum efficiency of the image sensor in a red wavelength spectrum to the maximum peak external quantum efficiency of the image sensor in the green wavelength spectrum, or both thereof are greater than or equal to about 0.5.

2. The image sensor of claim 1, wherein the first organic photoelectric conversion device is configured to selectively absorb light in the green wavelength spectrum and convert the selectively absorbed light in the green wavelength spectrum into the first electrical signal.

3. The image sensor of claim 2, wherein the first optical filter is configured to selectively transmit light in at least the blue wavelength spectrum.

4. The image sensor of claim 3, wherein the second optical filter is configured to selectively transmit light in at least the red wavelength spectrum.

5. The image sensor of claim 1, wherein the first organic photoelectric conversion layer of the first organic photoelectric conversion device and the second organic photoelectric conversion layer of the second organic photoelectric conversion device each independently include at least one p-type semiconductor material and at least one n-type semiconductor material.

6. The image sensor of claim 5, wherein
the first organic photoelectric conversion device includes
at least one buffer layer of
a first buffer layer between the first upper electrode and the first organic photoelectric conversion layer, or
a second buffer layer between the first lower electrode and the first organic photoelectric conversion layer, and
the second organic photoelectric conversion device includes at least one buffer layer of
a third buffer layer between the second upper electrode and the second organic photoelectric conversion layer, or a fourth buffer layer between the second lower electrode and the second organic photoelectric conversion layer.

7. The image sensor of claim 6, wherein the buffer layer includes a lanthanide element, calcium (Ca), potassium (K), aluminum (Al), or an alloy thereof.

8. The image sensor of claim 6, wherein the at least one buffer layer includes a compound represented by Chemical Formula B-1, a compound represented by Chemical Formula B-2, or a combination thereof:

[Chemical Formula B-1]

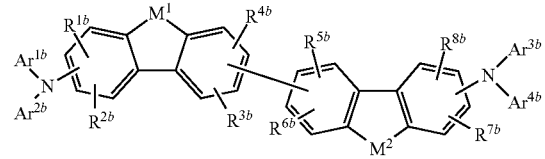

[Chemical Formula B-2]

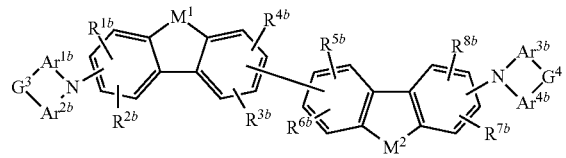

wherein, in Chemical Formulas B-1 and/or B-2, $M^1$ and $M^2$ are independently $CR^kR^l$, $SiR^mR^n$, $NR^o$, O, S, Se, or Te, $Ar^{1b}$ to $Ar^{4b}$ are independently a substituted or unsubstituted C6 to C30 aryl group or a substituted or unsubstituted C3 to C30 heteroaryl group, $G^3$ and $G^4$ are independently a single bond, $-(CR^pR^q)_{n2}-$, wherein n2 is an integer of 1 or 2, $-O-$, $-S-$, $-Se-$, $-N=$, $-NR^r-$, $-SiR^sR^t-$, or $-GeR^uR^v-$, and $R^{1b}$ to $R^{8b}$ and $R^k$ to $R^v$ are independently hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group.

9. The image sensor of claim 5, wherein
The first lower electrode of the first organic photoelectric conversion device is electrically connected to the substrate through a charge transfer conduit, and
a length of the charge transfer conduit in the vertical direction is greater than or equal to about 150 nm and less than or equal to about 1500 nm.

10. The image sensor of claim 9, wherein a maximum aspect ratio of the charge transfer conduit is greater than or equal to about 1.0 and less than or equal to about 15.0.

11. The image sensor of claim 9, wherein the substrate does not include any silicon-based photodiode.

12. The image sensor of claim 5, wherein the at least one p-type semiconductor material of the first organic photoelectric conversion device and the at least one p-type semiconductor material of the second organic photoelectric conversion device independently include a compound represented by Chemical Formula A-1:

[Chemical Formula A-1]

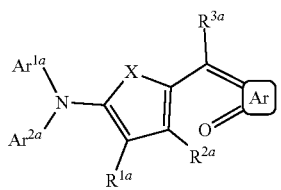

wherein, in Chemical Formula A-1,

X is O, S, Se, Te, SO, SO$_2$, or SiR$^a$R$^b$,

Ar is a substituted or unsubstituted C6 to C30 arylene group, a substituted or unsubstituted C3 to C30 heterocyclic group, or a first fused ring of two or more thereof, Ar$^{1a}$ and Ar$^{2a}$ are independently a substituted or unsubstituted C6 to C30 aryl group or a substituted or unsubstituted C3 to C30 heteroaryl group, Ar$^{1a}$ and Ar$^{2a}$ are independently present or are linked to each other to form a second fused ring, and R$^{1a}$ to R$^{3a}$, R$^a$, and R$^b$ are independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a combination thereof.

13. The image sensor of claim 5, wherein the at least one p-type semiconductor material of the first organic photoelectric conversion device and the at least one p-type semiconductor material of the second organic photoelectric conversion device independently include one or more compounds represented by any one of Chemical Formulas A-2 to A-9:

[Chemical Formula A-2]

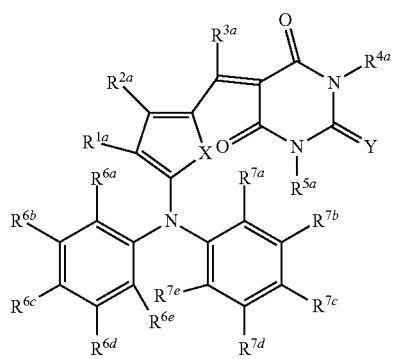

[Chemical Formula A-3]

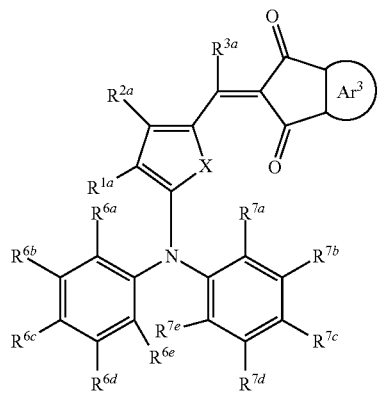

[Chemical Formula A-4]

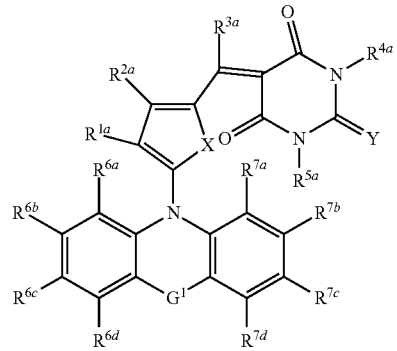

[Chemical Formula A-5]

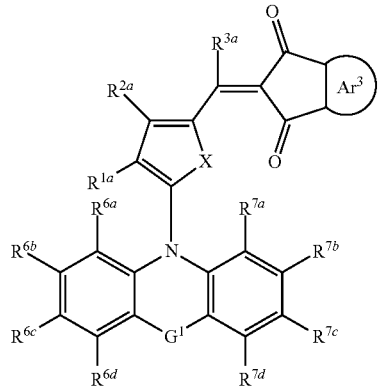

[Chemical Formula A-6]

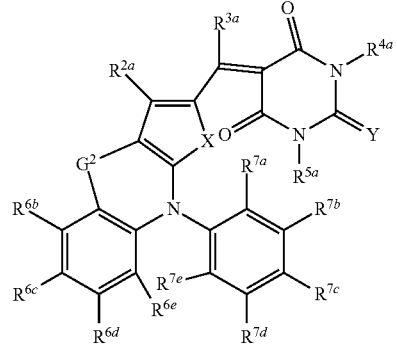

-continued

[Chemical Formula A-7]

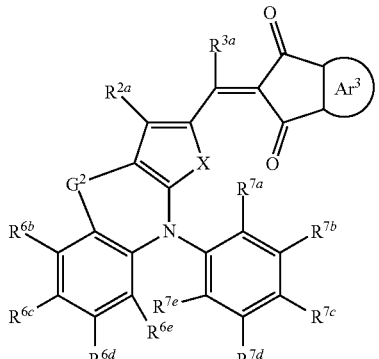

[Chemical Formula A-8]

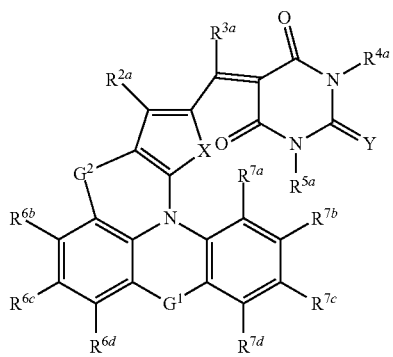

[Chemical Formula A-9]

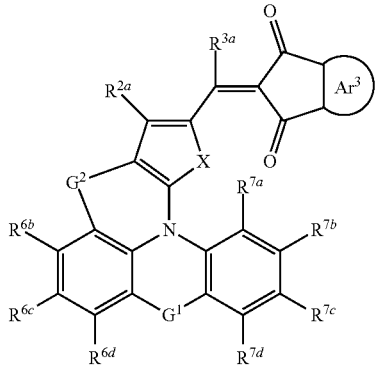

wherein, in Chemical Formulas A-2 to A-9,

X is O, S, Se, Te, SO, SO$_2$, or SiR$^a$R$^b$,

Ar$^3$ is a substituted or unsubstituted C6 to C30 arylene group, a substituted or unsubstituted C3 to C30 heterocyclic group, or a first fused ring of two or more thereof, R$^{1a}$ to R$^{5a}$, R$^a$, and R$^b$ are independently one of hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a combination thereof, G$^1$ and G$^2$ are independently a single bond, —(CR$^c$R$^d$)$_{n1}$— wherein n1 is an integer of 1 or 2, —O—, —S—, —Se—, —N=, —NR$^e$—, —SiR$^f$R$^g$—, or —GeR$^h$R$^i$—, wherein R$^c$ to R$^i$ are independently hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, a cyano group, or a combination thereof, wherein R$^c$ and R$^d$, R$^f$ and R$^g$, and R$^h$ and R$^i$ are independently present or are linked to each other to form a ring, Y is O, S, Se, Te, or C(R$^j$)(CN), wherein R$^j$ is hydrogen, a cyano group (—CN), or a C1 to C10 alkyl group, R$^{6a}$ to R$^{6e}$ and R$^{7a}$ to R$^{7e}$ are independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a combination thereof, and R$^{1a}$ to R$^{3a}$, R$^{6a}$ to R$^{6e}$, and R$^{7a}$ to R$^{7e}$ are independently present or adjacent two thereof are linked to each other to form a second fused ring.

14. The image sensor of claim 5, wherein a content of the n-type semiconductor material of the second organic photoelectric conversion device is between about 1.0 time and about 100.0 times of a content of the n-type semiconductor material of the first organic photoelectric conversion device.

15. The image sensor of claim 5, wherein the organic photoelectric conversion layer of the first organic photoelectric conversion device has a volume ratio of the n-type semiconductor material to the p-type semiconductor material of greater than or equal to about 0.2 and less than or equal to about 2.0.

16. The image sensor of claim 5, wherein the organic photoelectric conversion layer of the second organic photoelectric conversion device has a volume ratio of the n-type semiconductor material to the p-type semiconductor material of greater than or equal to about 2.0 and less than or equal to about 20.0.

17. The image sensor of claim 5, wherein the at least one n-type semiconductor material of the first organic photoelectric conversion device and the at least one n-type semiconductor material of the second organic photoelectric conversion device independently include one or more of an organic metal complex, a derivative of an organic metal complex, carboxylic anhydride, a derivative of carboxylic anhydride, perylene diimide, a derivative of perylene diimide, thiophene, a thiophene derivative, fullerene, a fullerene derivative, or a combination thereof.

18. The image sensor of claim 5, wherein the at least one n-type semiconductor material of the first organic photoelectric conversion device and the at least one n-type semiconductor material of the second organic photoelectric conversion device independently include one or more of fullerene or a fullerene derivative.

19. The image sensor of claim 1, further comprising:
an insulating layer between the first organic photoelectric conversion device and the first optical filter, between the second organic photoelectric conversion device and the first optical filter, between the first organic photoelectric conversion device and the second optical filter, between the second organic photoelectric conversion device and the second optical filter, or a combination thereof.

20. An image processing apparatus comprising the image sensor of claim 1.

21. An electronic device comprising the image sensor of claim 1.

22. An image sensor, comprising:
a first partition including a blue organic photoelectric conversion device and a first portion of a green organic photoelectric conversion device overlapping the blue organic photoelectric conversion device in a vertical direction extending perpendicular to an upper surface of the green organic photoelectric conversion device, the blue organic photoelectric conversion device being configured to selectively absorb light in a blue wavelength spectrum and convert the selectively absorbed light in the blue wavelength spectrum into a first electrical signal, the first portion of the green organic photoelectric conversion device being configured to selectively absorb light in a green wavelength spectrum and convert the selectively absorbed light in the green wavelength spectrum into a second electrical signal; and a second partition including a red organic photoelectric conversion device and a second portion of the green organic photoelectric conversion device overlapping the red organic photoelectric conversion device in the vertical direction, the blue organic photoelectric conversion device and the red organic photoelectric conversion device overlapping in an in-plane direction extending in parallel to the upper surface of the green organic photoelectric conversion device, the red organic photoelectric conversion device being configured to selectively absorb light in a red wavelength spectrum and convert the selectively absorbed light in the red wavelength spectrum into a third electrical signal, the second portion of the green organic photoelectric conversion device being configured to selectively absorb light in the green wavelength spectrum and convert the selectively absorbed light in the green wavelength spectrum into a fourth electrical signal, wherein a ratio of a maximum peak external quantum efficiency in the blue wavelength spectrum to a maximum peak external quantum efficiency in the green wavelength spectrum, a ratio of a maximum peak external quantum efficiency in the red wavelength spectrum to the maximum peak external quantum efficiency in the green wavelength spectrum, or both thereof are greater than or equal to about 0.5.

23. The image sensor of claim 22, wherein the blue organic photoelectric conversion device, the green organic photoelectric conversion device, and the red organic photoelectric conversion device independently include
an upper electrode,
a lower electrode, and
an organic photoelectric conversion layer between the upper electrode and the lower electrode, the organic photoelectric conversion layer including at least one p-type semiconductor material and at least one n-type semiconductor material.

24. The image sensor of claim 23, wherein
the blue organic photoelectric conversion device, the red organic photoelectric conversion device, and the green organic photoelectric conversion device are on a substrate,
the lower electrode of the blue organic photoelectric conversion device is connected to the substrate through a first charge transfer conduit and the lower electrode of the red organic photoelectric conversion device is connected to the substrate through a second charge transfer conduit, and
respective lengths of the first charge transfer conduit and the second charge transfer conduit in the vertical direction are independently greater than or equal to about 50 nm and less than or equal to about 500 nm.

25. The image sensor of claim 24, wherein the substrate does not include any silicon-based photodiode.

26. The image sensor of claim 24, wherein maximum aspect ratios of the first charge transfer conduit and the second charge transfer conduit are independently greater than or equal to about 0.5 and less than or equal to about 10.0.

27. The image sensor of claim 23, wherein the blue organic photoelectric conversion device, the green organic photoelectric conversion device, and the red organic photoelectric conversion device independently have a volume ratio of the n-type semiconductor material thereof to the p-type semiconductor material thereof of greater than or equal to about 0.2 and less than or equal to about 2.0.

28. The image sensor of claim 23, wherein the at least one p-type semiconductor material of the blue organic photoelectric conversion device includes thiophene, a thiophene derivative, rubrene, a rubrene derivative, tetracene, a tetracene derivative coumarin, a coumarin derivative, or a combination thereof.

29. The image sensor of claim 23, wherein the at least one p-type semiconductor material of the green organic photoelectric conversion device includes a compound represented by Chemical Formula A-1:

[Chemical Formula A-1]

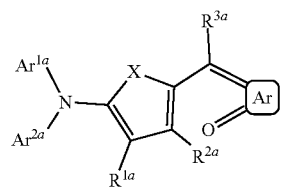

wherein, in Chemical Formula A-1,
X is O, S, Se, Te, SO, SO$_2$, or SiR$^a$R$^b$,
Ar is a substituted or unsubstituted C6 to C30 arylene group, a substituted or unsubstituted C3 to C30 heterocyclic group, or a first fused ring of two or more thereof,
Ar$^{1a}$ and Ar$^{2a}$ are independently a substituted or unsubstituted C6 to C30 aryl group or a substituted or unsubstituted C3 to C30 heteroaryl group,
Ar$^{1a}$ and Ar$^{2a}$ are independently present or linked to each other to form a second fused ring, and
R$^{1a}$ to R$^{3a}$, R$^a$, and R$^b$ are independently hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a combination thereof.

30. The image sensor of claim 23, wherein the at least one p-type semiconductor material of the red organic photoelectric conversion device includes a metal-phthalocyanine or a metal-phthalocyanine derivative.

31. The image sensor of claim 23, wherein the at least one n-type semiconductor material of the blue organic photoelectric conversion device, the at least one n-type semiconductor material of the green organic photoelectric conversion device, and the at least one n-type semiconductor material of the red organic photoelectric conversion device independently include an organic metal complex, a derivative of an organic metal complex, carboxylic anhydride, a derivative of carboxylic anhydride, perylene diimide, a derivative of perylene diimide, thiophene, a thiophene derivative, fullerene, a fullerene derivative, or a combination thereof.

32. The image sensor of claim 23, wherein the n-type semiconductor material of at least one of the blue organic photoelectric conversion device, the green organic photoelectric conversion device, or the red organic photoelectric conversion device includes fullerene or a fullerene derivative.

33. The image sensor of claim 22, further comprising:
an optical filter between a light incidence side of the image sensor and the red organic photoelectric conversion device, the optical filter being configured to selectively absorb light in the blue wavelength spectrum.

34. An image processing apparatus comprising the image sensor of claim 22.

35. An electronic device comprising the image sensor of claim 22.

36. The image sensor of claim 22, wherein at least respective photoelectric conversion layers of the blue organic photoelectric conversion device and the red organic photoelectric conversion device are isolated from direct contact with each other in the in-plane direction.

37. An image sensor, comprising:
a substrate;
a first organic photoelectric conversion device on the substrate, the first organic photoelectric conversion device being configured to selectively absorb light in a first wavelength spectrum within a visible wavelength spectrum and convert the selectively absorbed light in the first wavelength spectrum into a first electrical signal; and
a second organic photoelectric conversion device on the substrate and at least partially overlapping the first organic photoelectric conversion device in a vertical direction that is perpendicular to an upper surface of the substrate, the second organic photoelectric conversion device being configured to selectively absorb light in a second wavelength spectrum within the visible wavelength spectrum and convert the selectively absorbed light in the second wavelength spectrum into a second electrical signal, the second wavelength spectrum being different from the first wavelength spectrum,
wherein the image sensor has a first partition and a second partition offset from each other along an in-plane direction that is perpendicular to the vertical direction and parallel to the upper surface of the first organic photoelectric conversion device,
wherein the first partition includes a first portion of the first organic photoelectric conversion device and a first portion of the second organic photoelectric conversion device, and the second partition includes a second portion of the first organic photoelectric conversion device and a second portion of the second organic photoelectric conversion device,
wherein at least one of the first partition or the second partition includes a first optical filter configured to selectively transmit at least light in a third wavelength spectrum within the visible wavelength spectrum and selectively absorb light in at least a portion of at least one of the first wavelength spectrum or the second wavelength spectrum, the third wavelength spectrum being different from the first wavelength spectrum and the second wavelength spectrum, where the first optical filter is
between a light incidence surface of the image sensor and the first organic photoelectric conversion device in the vertical direction, or
between the first organic photoelectric conversion device and the second organic photoelectric conversion device in the vertical direction,
wherein the first organic photoelectric conversion device includes a first upper electrode, a first lower electrode, and a first organic photoelectric conversion layer between the first upper electrode and the first lower electrode, the first organic photoelectric conversion layer configured to selectively absorb light in the first wavelength spectrum of the visible wavelength spectrum,
wherein the second organic photoelectric conversion device includes a second upper electrode, a second lower electrode, and a second organic photoelectric conversion layer between the second upper electrode and the second lower electrode, the second organic photoelectric conversion layer configured to non-selectively absorb light in an entirety of the visible wavelength spectrum, and
wherein a ratio of a maximum peak external quantum efficiency of the image sensor in a blue wavelength spectrum to a maximum peak external quantum efficiency of the image sensor in a green wavelength spectrum, a ratio of a maximum peak external quantum efficiency of the image sensor in a red wavelength spectrum to the maximum peak external quantum efficiency of the image sensor in the green wavelength spectrum, or both thereof are greater than or equal to about 0.5.

38. The image sensor of claim 37, wherein
the first organic photoelectric conversion device is under the second organic photoelectric conversion device, and
the first optical filter is between the light incidence surface of the image sensor and the second organic photoelectric conversion device in the vertical direction.

39. The image sensor of claim 38, wherein
the first optical filter is included in one of the first partition or the second partition and is not included in another one of the first partition or the second partition, such that
the first optical filter overlaps the second portions of the first and second organic photoelectric conversion devices in the vertical direction and does not overlap the first portions of the first and second organic photoelectric conversion devices in the vertical direction, or
the first optical filter overlaps the first portions of the first and second organic photoelectric conversion devices in the vertical direction and does not overlap the second portions of the first and second organic photoelectric conversion devices in the vertical direction, and
the first optical filter is configured to selectively transmit light in both the first and third wavelength spectrums.

40. The image sensor of claim 39, wherein
the first optical filter overlaps the first portions of the first and second organic photoelectric conversion devices in the vertical direction and does not overlap the second portions of the first and second organic photoelectric conversion devices in the vertical direction,
the second partition includes a second optical filter that overlaps the second portions of the first and second organic photoelectric conversion devices in the vertical direction and does not overlap the first portions of the first and second organic photoelectric conversion devices in the vertical direction, and the second optical filter is configured to selectively transmit light in both the first wavelength spectrum and a fourth wavelength spectrum, the fourth wavelength spectrum being within the visible wavelength spectrum, the fourth wavelength spectrum being different from each of the first to third wavelength spectrums.

41. The image sensor of claim 40, wherein
the first wavelength spectrum is the green wavelength spectrum,
the second wavelength spectrum includes both the blue wavelength spectrum and the red wavelength spectrum and does not include the green wavelength spectrum,
the third wavelength spectrum is the blue wavelength spectrum, and
the fourth wavelength spectrum is the red wavelength spectrum.

42. The image sensor of claim 39, wherein
the first wavelength spectrum is the green wavelength spectrum,
the second wavelength spectrum includes both the blue wavelength spectrum and the red wavelength spectrum and does not include the green wavelength spectrum, and
the third wavelength spectrum is the blue wavelength spectrum or the red wavelength spectrum.

43. The image sensor of claim 37, wherein
the second wavelength spectrum is the visible wavelength spectrum, and the first wavelength spectrum and the third wavelength spectrum are both within the visible wavelength spectrum, such that the first organic photoelectric conversion device is configured to selectively absorb light in the first wavelength spectrum within the visible wavelength spectrum, and the second organic photoelectric conversion device is under the first organic photoelectric conversion device and is configured to non-selectively absorb light in the visible wavelength spectrum, the first partition includes the first optical filter between the first portions of the first organic photoelectric conversion device and the second organic photoelectric conversion device in the vertical direction, the first optical filter being configured to selectively transmit light in the third wavelength spectrum, and the second partition includes a second optical filter between the second portions of the first organic photoelectric conversion device and the second organic photoelectric conversion device in the vertical direction, the second optical filter being configured to selectively transmit light in a fourth wavelength spectrum within the visible wavelength spectrum, the fourth wavelength spectrum being different from each of the first, second, and third wavelength spectrums.

44. The image sensor of claim 43, wherein
the first wavelength spectrum is the green wavelength spectrum,
the third wavelength spectrum is the blue wavelength spectrum, and
the fourth wavelength spectrum is the red wavelength spectrum.

45. The image sensor of claim 37, wherein the first optical filter extends through both the first and second partitions, such that the first optical filter overlaps both the first and second portions of both the first organic photoelectric conversion device and the second organic photoelectric conversion device in the vertical direction.

* * * * *